United States Patent
Otsuki et al.

(10) Patent No.: US 6,261,697 B1
(45) Date of Patent: *Jul. 17, 2001

(54) PLATED MOLDED ARTICLE AND PROCESS FOR PRODUCING A PLATED MOLDED ARTICLE

(75) Inventors: Yusuke Otsuki; Akihiko Okada, both of Ichihara (JP)

(73) Assignee: Idemitsu Petrochemical Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/385,891

(22) Filed: Aug. 30, 1999

Related U.S. Application Data

(63) Continuation of application No. 08/809,294, filed on Mar. 27, 1997, now Pat. No. 6,027,817.

(30) Foreign Application Priority Data

| Jul. 28, 1995 | (JP) | ................................................ 7-192803 |
| Sep. 21, 1995 | (JP) | ................................................ 7-242803 |
| Dec. 6, 1995 | (JP) | ................................................ 7-318163 |
| Dec. 13, 1995 | (JP) | ................................................ 7-324176 |

(51) Int. Cl.$^7$ ............................. B32B 15/08; C25D 5/56
(52) U.S. Cl. ..................... 428/461; 428/409; 205/168
(58) Field of Search ................ 216/53, 83; 205/159, 205/163, 164, 168; 428/212, 220, 461, 409

(56) References Cited

U.S. PATENT DOCUMENTS

| 3,533,828 | 10/1970 | Rowe et al. | 428/461 |
| 3,663,325 | 5/1972 | Uda et al. | 216/83 |
| 3,918,927 | 11/1975 | Wells | 205/168 |
| 4,349,421 | 9/1982 | Khattab | 205/168 |
| 5,004,649 | 4/1991 | Yamasaki et al. | 428/461 |
| 5,232,744 | 8/1993 | Nakamura et al. | 427/437 |
| 5,702,584 | 12/1997 | Goenka et al. | 205/168 |
| 6,027,817 | * 2/2000 | Otsuki et al. | 428/461 |

FOREIGN PATENT DOCUMENTS

| 1 669 701 | 3/1971 | (DE) . |
| 0 102 133 | 3/1984 | (EP) . |
| 1 190 706 | 5/1970 | (GB) . |

* cited by examiner

*Primary Examiner*—Paul Thibodeau
*Assistant Examiner*—D Lawrence Tarazano
(74) *Attorney, Agent, or Firm*—Oblon, Spivak, McClelland, Maier & Neustadt, P.C.

(57) ABSTRACT

A plated molded article which comprises a molded article formed with a resin composition comprising specific relative amounts of (A) a styrenic polymer having a syndiotactic configuration and (B) at least one selected from the group consisting of (a) rubbery elastomers soluble in an oxidizing agent, (b) thermoplastic resins soluble in an oxidizing agent, and (c) inorganic compounds soluble in an oxidizing agent, and has been plated; and a process for producing the plated molded article. A plated molded article containing a styrenic polymer having a syndiotactic configuration which suppresses skipped plating and has a high adhesive strength of the plating film can efficiently be obtained with stability in an industrial process.

10 Claims, No Drawings

PLATED MOLDED ARTICLE AND PROCESS FOR PRODUCING A PLATED MOLDED ARTICLE

This application is a Continuation of application Ser. No. 08/809,294 Filed on Mar. 27, 1997, now U.S. Pat. No. 6,027,817, which was filed as International Application No. PCT/JP96/02105, filed Jul. 26, 1996.

TECHNICAL FIELD

The present invention relates to a plated molded article containing a styrenic polymer having a syndiotactic configuration as the major component thereof and a process for producing the article. More particularly, the present invention relates to a plated molded article advantageously used for electric and electronic parts, such as printed boards, MID (molded interconnected devices), and electromagnetic wave shields, and high precision parts used in home electric appliances, and a process for producing the article.

BACKGROUND ART

Styrenic polymers having a syndiotactic configuration (occasionally referred to as SPS hereinafter) have excellent heat stability, electric properties, and dimensional stability against moisture absorption and used for various types of high precision parts as engineering plastics. Furthermore, it has been desired that metal plated articles of SPS are developed and widely used in new fields in which plated articles of conventional acrylonitrile-butadiene-styrene copolymers (ABS) cannot be used.

Generally for plating plastic molded articles, roughness is formed on the surface of the articles by using an oxidizing agent such as chromic acid (etching), and a metal is tightly attached to the resultant surface by taking advantage of the rough structure (an anchor). In ABS which is widely used as a plastic material with plating, the butadiene part is dissolved in oxidizing agents to form the anchor because butadiene (B) is easily soluble in oxidizing agents. Therefore, the plating of ABS is easily performed.

In contrast, plating of SPS has been difficult because SPS is excellent in chemical resistance and does not have any part corresponding to that of butadiene (B) in ABS.

Generally when ABS is plated, the surface of an article is treated for formation of roughness, and after a catalyst for chemical plating is provided to the resultant surface by a combination of catalyzing and acceleration or a combination of sensitizing and activation, the surface is chemically plated, and the chemically plated surface is then electrically plated.

However, when the process described above is applied to a molded article containing SPS, problems arise in that skipped plating frequently takes place in the chemical plating, and in that a plating film having a sufficient adhesive strength cannot be obtained. Because of these reasons, no molded article having a plating film of metallic appearance has heretofore been obtained from a molded article containing SPS.

On the other hand, the plating property of plastics which do not contain any part easily soluble in an oxidizing agent, such as engineering plastics such as polycarbonates (PC) and modified polyphenylene ethers (Noryl) and general-purpose plastics such as polypropylene (PP), can be improved by blending a substance easily soluble in an oxidizing agent (Japanese Patent Application Laid-Open No. Showa 53(1978)-88876, Japanese Patent Application Laid-Open No. Showa 53(1978)-140348, Japanese Patent Application Laid-Open No. Showa 63(1988)-215760, and Japanese Patent Application Laid-Open No. Heisei 2(1990) 59178).

However, the basic physical properties of SPS, such as melting point, glass transition temperature, and rate of crystallization, the surface condition of molded articles containing SPS, and the conditions suitable for obtaining molded articles containing SPS are entirely different from those of other engineering plastics, such as PC and Noryl and general-purpose plastics, such as PP or those of molded articles containing such plastics. Therefore, it has been difficult to obtain a plated molded article having a sufficient adhesive strength of the plated film by simple application of conventional technologies.

Under the above circumstances, the present inventors undertook extensive studies to solve the above problems and to obtain a plated molded article containing SPS which has a high adhesive strength of the plating film and can be produced with stability in an industrial process.

DISCLOSURE OF THE INVENTION

As the result of the above studies, the present inventors discovered that a good anchor cannot be obtained even under severe conditions when SPS alone is used as the material, and accordingly the problems cannot be solved. The present inventors studied further and enabled exhibiting a good adhesive strength of a plating film for the first time by blending a substance soluble in an oxidizing agent with SPS.

The present inventors also discovered that the easiness of etching SPS (the easiness of dissolving SPS into an oxidizing agent) is different in crystalline parts and in amorphous parts of SPS, and the crystalline parts are dissolved into an oxidizing agent with more difficulty than the amorphous parts. This discovery lead to another discovery that, by increasing the crystallinity, particularly by increasing the crystallinity in the parts close to the surface, the difficulty of dissolving SPS into an oxidizing agent can be more sharply contrasted with the easiness of dissolving the component soluble in an oxidizing agent, and it is possible that a still better anchor is formed.

The present inventors also discovered that the shape of the anchor has a great effect on the adhesive strength of plating film when SPS is used. This discovery lead to another discovery that, because the shape of the anchor is determined by the shape of the domain of the substance soluble in an oxidizing agent, the above problem can be solved by controlling the shape of the domain of the substance soluble in an oxidizing agent within a specific range.

The present inventors also discovered that the property for plating can be improved by mixing a specific amount of particulate elastomer having a specific particle diameter when SPS is used.

The present inventors also discovered that the property for plating can be improved by mixing a specific amount of inorganic compounds soluble in an oxidizing agent which have a specific particle diameter when SPS is used.

The present inventors also discovered that the property for plating can be improved by suppressing the content of water in the molded article to a specific value or less when SPS is used.

The present inventors also discovered that because SPS has an extremely low polarity, it is difficult that a catalyst for the chemical plating is attached to the surface in the catalyzing and acceleration or in the sensitizing and activation after the surface is treated with the etching, and this difficulty causes frequent occurrence of skipped plating and frequent exhibition of poor adhesive strength of the plating film. In relation to the above problem, the present inventors discovered that the skipped plating can be prevented and a plated molded article containing SPS with a high adhesive strength of the plating film can efficiently be obtained when a molded article formed with a specific resin composition containing SPS is treated by the processes of forming roughness on the surface (the etching treatment), providing polarity to the surface, and plating the surface, successively. The present invention has been completed on the basis of the above discoveries.

Accordingly, the present invention has:

(1) An object to provide a plated molded article which comprises a molded article formed with a resin composition comprising (A) 20 to 99% by weight of a styrenic polymer having a syndiotactic configuration and (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and has been plated;

(2) Another object to provide a plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and (C) 1 to 350 parts by weight of an inorganic filler of glass based on 100 parts by weight of the total of component (A) and component (B), and has been plated;

(3) Still another object to provide a plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, (C) 1 to 350 parts by weight of an inorganic filler of glass based on 100 parts by weight of the total of component (A) and component (B), and (D) 0.5 to 10 parts by weight of a polymer having compatibility or affinity with component (A) and having a polar group based on 100 parts by weight of the total of component (A) and component (B), and has been plated;

(4) Still another object to provide a plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), and has been plated, wherein the styrenic polymer having a syndiotactic configuration in the surface part of the molded article within a depth of 100 $\mu$m from the surface has a crystallinity of 15% or more;

(5) Still another object to provide a plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), and has been plated, wherein domains formed by component (B) in the surface part of the molded article within a depth of 50 $\mu$m from the surface has a ratio of the length of the major axis to the length of the minor axis of 10 or less;

(6) Still another object to provide a plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), and has been plated, wherein domains formed by component (B) in the surface part of the molded article within a depth of 50 $\mu$m from the surface have a ratio of the length of the major axis to the length of the minor axis of 10 or less and a length of the major axis of 5 $\mu$m or less;

(7) Still another object to provide a plated molded article which comprises a molded article formed with a resin composition comprising (A) 100 parts by weight of a styrenic polymer having a syndiotactic configuration and (B) (a') 1 to 100 parts by weight of a particulate elastomer having an average particle diameter of 0.5 $\mu$m or less and soluble in an oxidizing agent, and has been plated;

(8) Still another object to provide a plated molded article which comprises a molded article formed with a resin composition comprising (A) 100 parts by weight of a styrenic polymer having a syndiotactic configuration and (B) (c') 3 to 100 parts by weight of inorganic compounds having an average particle diameter of 6 $\mu$m or less and a coefficient of variation of the particle diameter of 0.8 or less and soluble in an oxidizing agent, and has been plated;

(9) Still another object to provide a plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), and has been plated, wherein the content of water in the molded article is 4,000 ppm or less;

(10) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration and (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent;

(11) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and (C) 1 to 350 parts by weight of an inorganic filler of glass based on 100 parts by weight of the total of component (A) and component (B);

(12) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, (C) 1 to 350 parts by weight of an inorganic filler of glass based on 100 parts by weight of the total of component (A) and component (B), and (D) 0.5 to 10 parts by weight of a polymer having compatibility or affinity with component (A) and having a polar group based on 100 parts by weight of the total of component (A) and component (B);

(13) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein the styrenic polymer having a syndiotactic configuration in the surface part of the molded article within a depth of 100 $\mu$m from the surface has a crystallinity of 15% or more;

(14) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein domains formed by component (B) in the surface part of the molded article within a depth of 50 $\mu$m from the surface have a ratio of the length of the major axis to the length of the minor axis of 10 or less:

(15) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein domains formed by component (B) in the surface part of the molded article within a depth of 50 $\mu$m from the surface have a ratio of the length of the major axis to the length of the minor axis of 10 or less and a length of the major axis of 5 $\mu$m or less;

(16) Still another object to provide a process for producing a plated molded article which comprises forming roughness on the surface, providing polarity to the surface, and plating the surface, successively, of a molded article formed with a resin composition comprising (A) 100 parts by weight of a styrenic polymer having a syndiotactic configuration and (B) (a') 1 to 100 parts by weight of a particulate elastomer having an average particle diameter of 0.5 $\mu$m or less and soluble in an oxidizing agent;

(17) Still another object to provide a process for producing a plated molded article which comprises forming roughness on the surface, providing polarity to the surface, and plating the surface, successively, of a molded article formed with a resin composition comprising (A) 100 parts by weight of a styrenic polymer having a syndiotactic configuration and (B) (c') 3 to 100 parts by weight of inorganic compounds having an average particle diameter of 6 $\mu$m or less and a coefficient of variation of the particle diameter of 0.8 or less and soluble in an oxidizing agent;

(18) Still another object to provide a process for producing a plated molded article which comprises forming roughness on the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein the content of water in the molded article is 4,000 ppm or less; and

(19) Still another object to provide a resin composition comprising (A) 100 parts by weight of a styrenic polymer having a syndiotactic configuration and (B) (c') 3 to 100 parts by weight of inorganic compounds having an average particle diameter of 6 µm or less and a coefficient of variation of the particle diameter of 0.8 or less and soluble in an oxidizing agent.

THE MOST PREFERRED EMBODIMENT TO CARRY OUT THE INVENTION

The components in the resin composition forming the plated molded article of the present invention are described in the following.

In the present invention, in order to achieve any of objects (1) to (19), a styrenic polymer having a syndiotactic configuration is used as component (A). The syndiotactic configuration in the styrenic polymer having a syndiotactic configuration means that the stereochemical structure has a syndiotactic configuration. In other words, phenyl groups and substituted phenyl groups of the side groups are alternately placed at the opposite positions with respect to the main chain formed with the carbon—carbon bond. The tacticity in the stereochemical structure is quantitatively determined by the measurement of the nuclear magnetic resonance using an isotope of carbon ($^{13}$C-NMR). The tacticity measured by the $^{13}$C-NMR method can show the content of a sequence in which a specific number of the constituting units are bonded in sequence, such as a diad in which two constituting units are bonded in sequence, a triad in which three constituting units are bonded in sequence, and a pentad in which five constituting units are bonded in sequence. In the present invention, the styrenic polymer having a syndiotactic configuration means polystyrene, a poly(alkylstyrene), a poly(halogenated styrene), a poly(halogenated alkylstyrene), a poly(alkoxystyrene), a poly(vinylbenzoic acid ester), a hydrogenation product of these polymers, a mixture of these polymers, or a copolymer containing constituting units of these polymers as the main components, which generally has a syndiotacticity of 75% or more, preferably 85% or more, expressed in terms of the content of the racemic diad, or 30% or more, preferably 50% or more, expressed in terms of the content of the racemic pentad. Examples of the poly(alkylstyrene) include poly(methylstyrene), poly(ethylstyrene), poly(isopropylstyrene), poly(tertiary-butylstyrene), poly(phenylstyrene), poly(vinylnaphthalene), and poly(vinylstyrene). Examples of the poly(halogenated styrene) include poly(chlorostyrene), poly(bromostyrene), and poly(fluorostyrene). Examples of the poly(halogenated alkylstyrene) include poly(chloromethylstyrene). Examples of the poly(alkoxystyrene) include poly(methoxystyrene) and poly(ethoxystyrene).

Preferable examples of the styrenic polymers among the polymers described above are polystyrene, poly(p-methylstyrene), Poly(m-methylstyrene), poly(p-tertiary-butylstyrene), poly(p-chlorostyrene), poly(m-chlorostyrene), poly(p-fluorostyrene), hydrogenated polystyrene, and copolymers containing constituting units of these polymers.

The styrenic polymers described above may be used singly or as a combination two or more types.

The styrenic polymer having a syndiotactic configuration described above can be prepared, for example, by polymerizing the styrenic monomer (the monomer corresponding to the styrenic polymer described above) in an inert hydrocarbon solvent or in the absence of a solvent by using a titanium compound and a condensation product of water and a trialkylaluminum as the catalyst (Japanese Patent Application Laid-Open No. Showa 62(1987)-187708). The poly(halogenated alkylstyrene) described above can be prepared, for example, in accordance with the process described in Japanese Patent Application Laid-Open No. Heisei 1(1989)-46912, and the hydrogenated polymer described above can be prepared, for example, in accordance with the process described in Japanese Patent Application Laid-Open No. Heisei 1(1989)-178505.

In the present invention, a resin composition for forming a plated molded article can be obtained by blending SPS with a substance soluble in an oxidizing agent, such as (a) a rubbery elastomer soluble in an oxidizing agent, (b) a thermoplastic resin soluble in an oxidizing agent, and (c) an inorganic compound soluble in an oxidizing agent, as component (B) in order to form an anchor suitable for plating by etching.

The rubbery elastomer used as component (a) of component (B) can suitably be selected from elastomers soluble in an oxidizing agent, such as dichromic acid, permanganic acid, a dichromic acid/sulfuric acid mixed solution, chromic acid, and a chromic acid/sulfuric acid mixed solution. Specific examples of the rubbery elastomer include natural rubber, polybutadiene, polyisoprene, polyisobutylene, neoprene, polysulfide rubbers, thiokol rubbers, acrylic rubbers, urethane rubbers, silicone rubbers, epichlorohydrin rubbers, styrene-butadiene block copolymers (SBR), hydrogenated styrene-butadiene block copolymers (SEB), styrene-butadiene-styrene block copolymers (SBS), hydrogenated styrene-butadiene-styrene block copolymers (SEBS), styrene-isoprene block copolymers (SIR), hydrogenated styrene-isoprene block copolymers (SEP), styrene-isoprene-styrene block copolymers (SIS), hydrogenated styrene-isoprene-styrene block copolymers (SEPS), ethylene-propylene rubbers (EPR), ethylene-propylene-diene rubbers (EPDM), and particulate elastomers of core-shell types, such as butadiene-acrylonitrile-styrene core-shell rubbers (ABS), methyl methacrylate-butadiene-styrene core-shell rubbers (MBS), methyl methacrylate-butyl acrylate-styrene core-shell rubbers (MAS), octyl acrylate-butadiene-styrene core-shell rubbers (MABS), alkyl acrylate-butadiene-acrylonitrile-styrene core-shell rubbers (AABS), butadiene-styrene core-shell rubbers (SBR), core-shell rubbers containing siloxanes such as methyl methacrylate-butyl acrylate siloxane.

Among the above rubbery elastomers, SBR, SEB, SBS, SEBS, SIR, SEP, SIS, SEPS, core-shell rubbers, EPR, EPDM, and rubbers obtained by modification of these rubbers are particularly preferably used. The rubbery elastomer soluble in an oxidizing agent may be used singly or as a combination of two or more types.

The thermoplastic resin used as component (b) of component (B) in the present invention can suitably be selected from thermoplastic resins soluble in an oxidizing agent, such as dichromic acid, permanganic acid, a dichromic acid/sulfuric acid mixed solution, chromic acid, and a chromic acid/sulfuric acid mixed solution. Specific examples of the thermoplastic resin include polyolefinic resins, such as linear high density polyethylene, linear low density polyethylene, low density polyethylene produced by the high pressure process, isotactic polypropylene, syndiotactic polypropylene, propylene-α-olefin block copolymers, block polypropylene, propylene-α-olefin random copolymers, random polypropylene, polybutene, 1,2-polybutadiene, cyclic polyolefins, and poly-4-methylpentene; polystyrenic resins, such as high impact polystyrenes (HIPS), and ABS; polyester resins, such as polyethylene terephthalate and polybutylene terephthalate; and polyamide resins, such as polyamide-6 and polyamide-66. The thermoplastic resin may be used singly or as a combination of two or more types.

Among these thermoplastic resins, polypropylene, polyethylene, ABS, and resins obtained by modifying these resins are particularly preferably used.

The inorganic compound used as component (c) of component (B) in the present invention can suitably be selected from inorganic compounds soluble in an oxidizing agent, such as dichromic acid, permanganic acid, a dichromic acid/sulfuric acid mixed solution, chromic acid, and a chromic acid/sulfuric acid mixed solution. The inorganic compound may have various shapes, such as a shape of fibers, a shape of particles, a shape of powder, and a shape of flakes. Examples of the inorganic compound which is soluble in an oxidizing agent and has a shape of fibers include wiskers and metal fibers.

Examples of the inorganic compounds which is soluble in an oxidizing agent and has a shape of particles or flakes include calcium carbonate, basic magnesium oxysulfate, magnesium carbonate, dolomite, dawsonite, magnesium hydroxide, kaolin, pioferrite, zeolite, nephelite, adamaine, palygorskite, antimony trioxide, titanium oxides, iron oxides, magnesium oxide, zinc oxide, and metal powders. Among these inorganic compounds soluble in an oxidizing agent, calcium carbonate is particularly preferable. The inorganic compound of component (c) of component (B) may be used singly or as a combination of two or more types where necessary.

As component (B), one or a desired combination of two or more selected from the group consisting of component (a), component (b), and component (c) may be used.

In the present invention, the amounts of component (A) and component (B) are selected in the range of 20 to 99% by weight with respect to component (A) and in the range of 80 to 1% by weight with respect to component (B). When a molded article is formed with a resin composition comprising less than 20% by weight of component (A), there is the possibility that the proper characteristics of SPS are not exhibited. When a molded article is formed with a resin composition comprising more than 99% by weight of component (A), it sometimes occurs that skipped plating takes place and adhesive strength of the plating film is insufficient because of insufficient formation of the anchor. In order to exhibit the proper characteristics of SPS, to suppress the skipped plating, and to have a sufficient adhesive strength of the plating film, the preferable amounts of component (A) and component (B) are in the range of 25 to 98% by weight with respect to component (A) and in the range of 75 to 2% by weight with respect to component (B). When the amounts of component (A) and component (B) are in the range of 30 to 95% by weight with respect to component (A) and in the range of 70 to 5% by weight with respect to component (B), a resin composition particularly preferable for forming the plated molded article can be obtained.

In the present invention, it is preferred for obtaining a plated molded article which contains SPS and has an improved heat resistance and rigidity that component (C) and component (D) are comprised in the resin composition.

The inorganic filler of glass used as component (C) of the present invention is described in the following.

As the inorganic filler of glass, an inorganic filler of glass having a shape of fibers, a shape of particles, a shape of powder, or a shape of flakes is used. The inorganic filler having a shape of fibers can be used in various forms, such as a cloth, a mat, cut bundles, and short fibers. When the inorganic filler is used in the form of cut bundles, the length is preferably 0.05 to 50 mm, and the diameter of the fiber is preferably 5 to 20 μm. As the inorganic filler of glass of component (C), an inorganic filler of glass the surface of which is treated with a coupling agent to improve adhesion with the resin is preferably used. As the coupling agent, a suitable coupling agent can be selected for use from conventional coupling agents, such as silane coupling agents and titanium coupling agents.

Specific examples of the silane coupling agent include triethoxysilane, vinyltris(β-methoxyethoxy)silane, -1-methacryloxypropyl-trimethoxysilane, γ-glycidoxypropyltrimethoxysilane, β-(1,1-epoxy-cyclohexyl)ethyltrimethoxysilane, N-β-(aminoethyl)-γ-aminopropyl-trimethoxysilane, N-β-(aminoethyl)-γ-aminopropylmethyldimethoxy-silane, γ-aminopropyltriethoxysilane, N-phenyl-γ-aminopropyl-trimethoxysilane, γ-mercaptopropyltrimethoxysilane, γ-chloro-propyltrimethoxysilane, γ-aminopropyltrimethoxysilane, γ-aminopropyl-tris(2-methoxyethoxy)silane, N-methyl-γ-aminopropyltrimethoxysilane, N-vinylbenzyl-γ-aminopropyltriethoxysilane, triaminopropyltrimethoxysilane, 3-ureydopropyltrimethoxysilane, 3-4,5-dihydroimidazole-propyltriethoxysilane, hexamethyldisilazane, and N,N-bis(trimethylsilyl)urea. Among these compounds, aminosilanes and epoxysilanes, such as γ-aminopropyltrimethoxysilane, N-β-(aminoethyl)-γ-aminopropyltrimethoxysilane, γ-glycidoxypropyltrimethoxysilane, and β-(3,4-epoxycyclohexyl)ethyltrimethoxysilane, are preferable.

Specific examples of the titanium coupling agent include isopropyl triisostearoyl titanate, isopropyl tridodecylbenzenesulfonyl titanate, isopropyl tris(dioctyl pyrophosphate) titanate, tetraisopropyl bis(dioctyl phosphite) titanate, tetraoctyl bis(ditridecyl phosphite) titanate, tetra(1,1-diallyloxymethyl-1-butyl) bis(ditridecyl) phosphite titanate, bis(dioctyl pyrophosphate)oxy acetate titanate, bis(dioctyl pyrophosphate) ethylene titanate, isopropyl trioctanoyl titanate, isopropyl dimethacryl isostearoyl titanate, isopropyl isostearoyl diacryl titanate, isopropyl tri(dioctyl phosphate) titanate, isopropyl tricumyl phenyl titanate, isopropyl tri(N-amidoethyl, aminoethyl) titanate, dicumyl phenyloxy acetate titanate, and diisostearoyl ethylene titanate. Among these compounds, isopropyl tri(N-amidoethyl, aminoethyl) titanate is preferable.

The surface treatment of the above inorganic filler of glass of component (C) using the coupling agent can be conducted by a conventional process, and the process is not particularly limited. Examples of the process include the sizing treatment comprising coating the inorganic filler with a sizing agent which is a solution or a suspension of the above coupling agent in an organic solvent, the dry mixing process using a Henschel mixer, a super mixer, a Redige mixer, or a V-blender, the spraying process, the integral blending process, and the dry concentrate process. Among the above processes, the sizing treatment, the dry mixing process, and the spraying process are preferable.

The amount of the inorganic filler of glass comprised in the resin composition is 1 to 350 parts by weight, preferably 5 to 200 parts by weight, more preferably 10 to 100 parts by weight, based on 100 parts by weight of the total of component (A) and component (B).

A film forming material for glass may additionally be used in combination with the coupling agent described above. The film forming material for glass is not particularly limited, and, for example, a polyester, a urethane polymer, an epoxy polymer, an acrylic polymer, a vinyl acetate polymer, or a polyether can be used.

The polymer which has compatibility or affinity with SPS, has a polar group therein, and is used as component (D) of the present invention is described in the following.

Component (D) described here is used in order to increase adhesion between SPS and the inorganic filler, particularly the inorganic filler of glass.

The polymer having compatibility or affinity with SPS means a polymer having a sequence of units showing compatibility or affinity with SPS in the polymer chain. Examples of such a polymer include polymers having syndiotactic polystyrene, atactic polystyrene, isotactic polystyrene, a styrenic copolymer, polyphenylene ether, or polyvinyl methyl ether as the main chain, block chains, or grafted chains. The polar group is not particularly limited as long as the polar group can increase the adhesion of SPS with the inorganic filler described above. Specific examples of the polar group include acid anhydride groups, carboxylic acid groups, carboxylic acid ester groups, carbonyl halide groups, carboxylic acid amide groups, carboxylic acid salt groups, sulfonic acid group, sulfonic acid ester groups, sulfonyl chloride group, sulfonyl amide groups, sulfonic acid salt groups, epoxy group, amino group, imide group, and oxazoline group.

Specific examples of component (D) include modified styrenic polymers, such as styrene-maleic anhydride copolymer (SMA), styrene-glycidyl methacrylate copolymer, polystyrenes modified with carboxylic acids at the ends, polystyrenes modified with epoxy group at the ends, polystyrenes modified with oxazoline group at the ends, polystyrenes modified with amine group at the ends, sulfonated polystyrenes, styrenic ionomers, styrene-methyl methacrylate graft polymers, (styrene-glycidyl methacrylate)-methyl methacrylate graft polymers, acrylate-styrene graft polymers modified with acids, (styrene-glycidyl methacrylate)-styrene graft polymers, polybutylene terephthalate-polystyrene graft polymers, syndiotactic polystyrene modified with maleic anhydride, syndiotactic polystyrene modified with fumaric acid, syndiotactic polystyrene modified with glycidyl methacrylate, and syndiotactic polystyrene modified with amines; and modified polyphenylene ethers, such as (styrene-maleic anhydride)-polyphenylene ether graft polymers, polyphenylene ethers modified with maleic anhydride, polyphenylene ethers modified with fumaric acid, polyphenylene ethers modified with glycidyl methacrylate, and polyphenylene ethers modified with amines. Among these polymers, modified polyphenylene ethers and modified syndiotactic polystyrenes are particularly preferable.

The amount of component (D) comprised in the resin composition is generally 0.5 to 10 parts by weight, preferably 1 to 8 parts by weight, more preferably 2 to 5 parts by weight, based on 100 parts by weight of the total of component (A) and component (B). When the amount is less than 0.5 parts by weight, it sometimes occurs that the effect of component (D) to promote adhesion between SPS and the inorganic filler is not exhibited. When the amount is more than 10 parts by weight, it sometimes occurs that the heat resistance and the chemical resistance of the resin composition are inferior.

The particulate elastomer soluble in an oxidizing agent used as component (a') of component (B) for objects (7) and (16) of the present invention is described in the following.

The particulate elastomer soluble in an oxidizing agent used as component (a') of component (B) in the present invention can suitably be selected from conventional particulate elastomers soluble in an oxidizing agent, such as dichromic acid, permanganic acid, a dichromic acid/sulfuric acid mixed solution, chromic acid, and a chromic acid/sulfuric acid mixed solution, and the chemical structure thereof is not particularly limited. Preferable examples of the particulate elastomer soluble in an oxidizing agent include butadiene-acrylonitrile-styrene core-shell rubbers (ABS), methyl methacrylate-butadiene-styrene core-shell rubbers (MBS), methyl methacrylate-butyl acrylate-styrene core-shell rubbers (MAS), octyl acrylate-butadiene-styrene core-shell rubbers (MABS), an alkyl acrylate-butadiene-acrylonitrile-styrene core-shell rubbers (AABS), butadiene-styrene core-shell rubbers (SBR), core-shell rubbers containing siloxanes, and particulate elastomers obtained by modifying these elastomers. Among these elastomers, core-shell elastomers containing siloxanes are particularly preferably used.

The particulate elastomer soluble in an oxidizing agent of component (a') of component (B) preferably has an average particle diameter of 0.5 $\mu$m or less, more preferably 0.45 $\mu$m or less, and most preferably 0.4 $\mu$m or less. When the average particle diameter is larger than 0.5 $\mu$m, it sometimes occurs that increasing the adhesive strength of the plating film is difficult because the anchor formed by dissolving the particulate elastomer into an oxidizing agent has an excessively large size and a good anchor effect cannot be exhibited. On the other hand, when the particle diameter is excessively small, the formation of a uniform anchor becomes rather difficult because the dispersion of the particulate elastomer becomes inferior by the aggregation of the particles. Therefore, the particle diameter is preferably 0.01 $\mu$m or more. The particulate elastomer of component (a') of component (B) may be used singly or as a combination of two or more types.

The inorganic compound soluble in an oxidizing agent used as component (c') of component (B) for objects (8), (17) and (19) of the present invention is described in the following.

The inorganic compound soluble in an oxidizing agent described above preferably has an average particle diameter of 6 $\mu$m or less, more preferably 5 $\mu$m or less, most preferably 4 $\mu$m or less. It is required that the coefficient of variation of the particle diameter of the inorganic compound be 0.8 or less. The coefficient of variation of the particle diameter is preferably 0.6 or less, more preferably 0.5 or less. When the particle diameter is excessively large, the size of the domain becomes excessively large, and forming a minute anchor by dissolving the domain is difficult. Therefore, it sometime occurs that the effective anchor effect is not obtained. When the coefficient of variation of the particle diameter is large (viz. the distribution of the particle diameter is broad), obtaining an anchor having a uniform distribution of the size is difficult, and it sometimes occurs that a sufficient adhesive strength of the plating film is not obtained.

The methods of measurements of the average particle diameter and the coefficient of variation of the particle diameter of the inorganic compound soluble in an oxidizing agent used in the present invention is described in the following.

In the present invention, the average particle diameter of the inorganic compound soluble in an oxidizing agent is the volume-average particle diameter measured by the laser diffraction method and can be obtained in accordance with the following equation (1):

(average particle diameter)=[(total volume of particles)/(total number of particles)])$^{1/3}$ (1)

The coefficient of variation of the particle diameter is the ratio of the standard deviation of the volume particle diameter to the average particle diameter. The distribution of the particle diameter is also measured by the laser diffraction method. The above coefficient can be obtained in accordance with following equation (2):

(coefficient of variation of particle diameter)=(standard deviation of particle diameter)/(average particle diameter) (2)

The standard deviation of the particle diameter used in the above equation can be obtained in accordance with the following equation (3):

(standard deviation of particle diameter)=[(total of squares of difference between diameter of individual particle and the average particle diameter described above)/(total number of particles)]$^{1/2}$ (3)

The inorganic compound soluble in an oxidizing agent of component (c') of component (B) may be used singly or as a combination of two or more types.

In the present invention, various types of additional ingredients, such as antioxidants, nucleating agents, plasticizers, mold releases, flame retardants, auxiliary flame retardants, pigments, carbon black, antistatic agents, thermoplastic resins other than component (b) of component (B) and component (D), and inorganic fillers other than component (c) of component (B) and component (C), may be added within the range that the objects of the present invention are not adversely affected.

As the nucleating agent, a nucleating agent can suitably be selected for use from conventional nucleating agents, such as metal salts of carboxylic acid such as aluminum di(p-t-butylbenzoate), metal salts of phosphoric acid such as methylenebis(2,4-di-t-butylphenol) acid phosphate sodium, talc, and phthalocyanine derivatives. The nucleating agent may be used singly or as a combination of two or more types.

As the plasticizer, a plasticizer can suitably be selected for use from conventional plasticizers, such as polyethylene glycol, polyamide oligomers, ethylenebisstearoamide, phthalic acid esters, polystyrene oligomers, polyethylene waxes, mineral oils, and silicone oils. The plasticizer may be used singly or as a combination of two or more types.

As the mold release, a mold release can suitably be selected for use from conventional mold releases, such as polyethylene waxes, silicone oils, long chain carboxylic acids, and salts of long chain carboxylic acids. The mold release may be used singly or as a combination of two or more types.

As the antioxidant, an antioxidant can suitably be selected for use from conventional antioxidants, such as phosphorus antioxidants, phenolic antioxidants, and sulfur antioxidants. The antioxidant may be used singly or as a combination of two or more types.

As the flame retardant, a flame retardant can suitably be selected for use from conventional flame retardants, such as brominated polymers such as brominated polystyrene, brominated syndiotactic polystyrene, and brominated polyphenylene ether, and brominated aromatic compounds such as brominated diphenylalkanes and brominated diphenyl ethers. As the auxiliary flame retardant, an auxiliary flame retardant can suitably be selected for use from conventional auxiliary flame retardants, such as antimony compounds such as antimony trioxide. The flame retardant and the auxiliary flame retardant may each be used singly or as a combination of two or more types.

As the thermoplastic resin other than component (b) of component (B) and component (D), a thermoplastic resin can suitably be selected for use from conventional thermoplastic resins other than component (b) of component (B) and component (D), such as atactic polystyrene, AS, polycarbonates, polyphenylene ether, and polyphenylene sulfide. The thermoplastic resin may be used singly or as a combination of two or more types.

As the inorganic filler other than component (c) of component (B) and component (C), an inorganic filler can suitably be selected for use from conventional inorganic fillers other than component (c) of component (B) and component (C), such as carbon fibers (CF), talc, carbon black, graphite, silica, mica, calcium sulfate, barium carbonate, magnesium sulfate, barium sulfate, tin oxides, alumina, and silicon carbide. The inorganic filler may be used singly or as a combination of two or more types.

The plated molded article of the present invention is formed with a resin composition prepared by mixing the components described above. The process for mixing the components is not particularly limited, and the conditions of mixing, such as the order of addition of the components and the method used for mixing, are selected as desired. The resin composition includes compositions prepared by mixing the components followed by melt kneading the obtained mixture. The process for the melt kneading is not particularly limited, and a conventional process can be utilized. For example, a material for molding can be obtained by melt kneading component (A), component (B), component (C), component (D), and various additives used where necessary by using a ribbon blender, a Henschel mixer, a Banbury mixer, a drum tumbler, a single screw extruder, a twin screw extruder, a cokneader, or a multi-screw extruder at a temperature of about 270 to 350° C.

A molded article having a desired shape can be obtained by molding the material for molding obtained as described above in accordance with a conventional process, such as the injection molding. The property for plating of SPS varies to a great extent depending on the morphology of the molded article, therefore it is possible that the property for plating is improved by controlling the morphology of the molded article to a specific range.

The crystallinity of the plated molded article of the present invention prepared from the above resin composition and the method for controlling the crystallinity are described in the following (objects (4) and (13) of the present invention).

In the plated molded article of the present invention, the styrenic polymer having a syndiotactic configuration in the surface part of the molded article within a depth of 100 $\mu$m from the surface preferably has a crystallinity of 15% or more, more preferably 20% or more, most preferably 25% or more. Generally in the injection molding, the surface of a molded article is rapidly cooled by the contact with a mold, and a skin layer is formed on the surface of the molded article. It sometimes occurs when SPS is used that the crystallization is not achieved to a high degree in the skin layer.

The plated molded article of the present invention is formed with the resin composition comprising SPS as the main component thereof. The rate of dissolving SPS into an oxidizing agent is different in the crystalline part and in the amorphous part of SPS, and the rate in the crystalline part is lower than that in the amorphous part. In order to exhibit an excellent anchor effect, it is more advantageous that the easiness of dissolving the domain into an oxidizing agent is more sharply contrasted with the difficulty of dissolving the matrix into the oxidizing agent when the domain is formed with a substance soluble in an oxidizing agent. Therefore, it is preferred that the matrix is formed by SPS having a higher crystallinity and less soluble in an oxidizing agent by using a method such as those described later.

Because the etching provides roughness to the surface of a molded article, the crystallinity to which the present invention is related is specifically the crystallinity in the surface part of the molded article within a depth of 100 μm from the surface. When the crystallinity of SPS in the surface part within a depth of 100 μm from the surface is controlled to 15% or more, preferably 20% ore more, more preferably 25% or more, a molded article having a uniform and high adhesive strength of plating film can be obtained. When the crystallinity is less than 15%, it sometimes occurs that a high adhesive strength of the plating film is not exhibited because the difficulty of etching SPS is less markedly contrasted with the easiness of etching the substance soluble in an oxidizing agent.

By using the area of an exothermic peak appearing in the vicinity of 110 to 170° C. and the area of an endothermic peak appearing in the vicinity of 240 to 270° C. in the measurement of the DSC with increasing temperature at a rate of 20° C./minute, the crystallinity used in the present invention can be obtained in accordance with the following equation:

$$\text{(crystallinity(\%))} = \frac{[(\text{area of endothermic peak } (J/g)) - (\text{area of exothermic peak } (J/g))]}{53(J/g)} \times$$

$$100 \div (\text{weight of SPS in the sample/total weight of the sample})$$

In the above equation, 53 (J/g) shows the enthalpy of melting of SPS containing 100% of the crystalline part.

The method for controlling the crystallinity of the molded article to 15% or more is not particularly limited, and methods such as those described in the following as examples can be used. The method described in the following may be used singly or as a combination of two or more methods.

(i) Specifying the Mold Temperature During Molding

In this method, the crystallization is promoted and the crystallinity is controlled by molding at a mold temperature higher than the glass transition temperature of SPS (Tg= 100° C.), preferably in the range of 100 to 200° C., more preferably in the range of 100 to 180° C. However, when the mold temperature is higher than 200° C., it sometimes occurs that the rate of crystallization is decreased to result in a longer time required for the crystallization and that the rigidity of the molded article is decreased to a great degree to cause difficulty in removing the molded article by an ejector. On the other hand, when the mold temperature is lower than 100° C., it is preferred that one of the following methods (ii) and (iii) is used or the two methods are used in combination.

(ii) Heat Treatment After the Molding

When the molding is conducted at a mold temperature lower than 100° C., the crystallization is sometimes insufficient. The crystallization is promoted and the crystallinity is controlled by heat treatment at 100 to 250° C. for 5 seconds or more after the molding has been conducted.

(iii) Addition of a Nucleating Agent or a Plasticizer

The crystallization is promoted and the crystallinity is controlled by addition of a nucleating agent or a plasticizer described above.

When the crystallinity of the molded article in the part in the vicinity of the surface is controlled to 15% or more and this molded article is used for plating, the plated molded article exhibits an excellent adhesive strength of the plating film.

The shape of the domain in the part in the vicinity of the surface of the plated molded article of the present invention and the method for controlling the shape are described in the following (objects (5), (6), (14), and (15) of the present invention).

In an article of SPS prepared by the injection molding, domains are sometimes oriented in the direction of the flow of the resin particularly in the skin layer. In the plated molded article of SPS, the shape of the anchor holes formed by dissolving the domain of component (B) into an oxidizing agent has a great effect on the adhesive strength of the plating film. When the anchor holes are oriented, in other words when the domain of component (B) at the surface layer of the molded article are oriented, a high adhesive strength of the plating film is not exhibited. Therefore, it is preferred that the orientation of the domain in the vicinity of the surface of the molded article is suppressed by some sort of method.

The shape of the domain to which the present invention is related is, specifically, the shape of the domain in the surface part of the molded article within a depth of 50 μm from the surface. When the domain in the surface part of the molded article within a depth of 50 μm from the surface have a ratio of the length of the major axis to the length of the minor axis of 10 or less, preferably 5 or less, more preferably 3 or less, a molded article having an excellent uniform adhesive strength of the plating film can be obtained. When the ratio of the length of the major axis to the length of the minor axis is more than 10, it sometimes occurs that the anchor effect is not effectively exhibited, and a high adhesive strength of the plating film is not achieved. When the length of the major axis is controlled preferably to 5 μm or less, more preferably to 3 μm or less, most preferably 1 μm or less, the adhesive strength of the plating film is further increased. In other words, the absolute size of the domain at the surface layer, more specifically the length of the major axis of the domain, affects the adhesive strength of the plating film. However, even when the length of the major axis of the domain is less than 5 μm, it sometimes occurs that a high adhesive strength of the plating film is not exhibited when the ratio of the length of the major axis to the length of the minor axis is more than 10.

When the domain of a molded article in the part in the vicinity of the surface have the shape described above and this molded article is used for the plating, the plated molded article exhibits an excellent adhesive strength of the plating film.

The ratio of the length of the major axis to the length of the minor axis of a domain of a molded article can be obtained in the following manner. A surface of the molded article in the direction of the flow of the material is exposed. Parts of the article arbitrarily selected in the part within 50 μm from the surface are observed. With each domain in the selected parts, the length of the major axis and the length of the minor axis of the domain are measured. The length of the major axis is divided by the length of the minor axis. The average of the obtained values with the domains in the selected parts is regarded as the ratio of the length of the major axis to the length of the minor axis of the domain at the surface of the molded article. The average of the lengths of the major axis obtained above is regarded as the length of the major axis of the domain at the surface of the molded article.

In the present invention, the method for controlling the shape of the domain is not particularly limited, and for example, the following methods (1) to (5) can be used.

(1) As the component of the domain, a substance soluble in an oxidizing agent which has an already fixed shape, such as the particulate elastomers soluble in an oxidizing agent and the inorganic compounds soluble in an oxidizing agent both described above, is used.

(2) The orientation of the component forming the domain is suppressed by adjusting the viscosities of SPS as the component forming the matrix and the substance soluble in an oxidizing agent as the component forming the domain in such a manner that the viscosity of the component forming the domain is higher than the viscosity of the component forming the matrix. SPS having a lower molecular weight may be used in this method. However, there is the possibility that a lower molecular weight of SPS used as the component forming the matrix causes decrease in the general physical properties of the molded article. When the balance between the factors described above is taken into consideration, the molecular weight of SPS in the plated molded article is preferably 80,000 to 450,000, more preferably 100,000 to 400,000, most preferably 120,000 to 350,000. As another method to adjust the viscosities, a plasticizer may be added to decrease the viscosity of the matrix.

(3) A compatibilizer of the component forming the domain and the component forming the matrix is added to finely disperse the component forming the domain. The shearing stress on the component forming the domain is decreased, and the orientation of the component forming the domain can be suppressed.

(4) By molding the resin composition at a mold temperature higher than Tg (the glass transition temperature) of SPS used as the component forming the domain, the shearing stress at the surface of the molded article is decreased, and the orientation of the component forming the domain in the vicinity of the surface is suppressed. The mold temperature is preferably 100 to 200° C., more preferably 110 to 180° C. When the mold temperature is higher than 200° C., it sometimes occurs that the property to release the molded article from the mold is inferior though the orientation of the domain at the surface of the molded article can be suppressed.

(5) By increasing the barrel temperature of molding to decrease the overall viscosity of the resin, the orientation of the domain is suppressed. The barrel temperature of molding is preferably 290 to 350° C., more preferably 300 to 320° C. When the barrel temperature of molding is higher than 350° C., the resin is decomposed by heat during the molding, and adverse effects, such as foaming, yellowing, bleeding, and decrease in the general physical properties, are caused. Therefore, such a temperature is not preferable. The methods described above may be used singly or as a combination of two or more methods.

The content of water in the obtained molded article is described in the following (objects (9) and (18) of the present invention).

In the present invention, the obtained molded article may possibly contain water. When the molded article contains water, there is the possibility that the contained water adversely affect the adhesive strength of the plating film.

In the present invention, the content of water in the molded article is preferably 4,000 ppm or less, more preferably 3,000 ppm. It is preferred for decreasing the content of water in the molded article that the molded article is heat treated and dried at a temperature in the range of 50 to 200° C. for 5 seconds or more, more preferably at a temperature of 60 to 180° C. for 5 seconds or more, before the molded article is plated.

The process for producing the plated molded article of the present invention is described in the following.

In order to obtain the plated molded article of the present invention, it is preferred that roughness is formed on the surface of the molded article before the article is plated, and then polarity is provided to the surface having the roughness. Subsequently, the surface having the polarity is treated by plating to obtain the plated molded article.

The process of plating described above generally includes the step of providing a catalyst for chemical plating to the surface, the step of chemical plating, and the step of electric plating. Therefore, the process of the present invention is generally constituted with (1) the process of forming a rough surface (the etching process), (2) the process of providing polarity to the surface, (3) the process of providing a catalyst for chemical plating to the surface, (4) the process of chemical plating, (5) the process of electric plating, and (6) the process of drying.

The process of forming a rough surface of process (1), i.e. the etching process, is the process in which anchor holes are formed on the surface of a molded article. The method of forming a rough surface (the method of etching) is not particularly limited, and conventionally used methods in the plating of plastic molded articles can be used. As the etching agent, for example, dichromic acid, permanganic acid, a dichromic acid/sulfuric acid mixed solution, chromic acid or a chromic acid/sulfuric acid mixed solution is used. The condition of the treatment is not particularly limited, and it is preferred that the treatment is conducted at a temperature in the range of 40 to 90° C., more preferably 50 to 80° C., generally for 30 seconds to 60 minutes, preferably for 1 to 40 minutes. When the molded article contains more than 99% by weight of SPS, because a good anchor cannot be obtained by this etching process, skipped plating tends to take place, and it sometimes occurs that a plating film having a high adhesive strength cannot be obtained.

In the process of providing polarity to the surface of process (2), the surface of the molded article which has been treated with the etching process is treated with a compound having polarity to provide the surface with the electric charge. Preferable examples of the agent used for the treatment to provide polarity include aqueous solutions of the following compounds and salts of the following compounds: aliphatic primary amines, such as methylamine, ethylamine, propylamine, isopropylamine, and butylamine; aliphatic secondary amines, such as dimethylamine, diethylamine, and dipropylamine; aliphatic tertiary amines, such as trimethylamine, triethylamine, and tripropylamine; aliphatic unsaturated amines, such as allylamine and diallylamine; alicyclic amines such as cyclopropylamine, cyclobutylamine, and cyclopentylamine; aromatic amines, such as aniline; alkylsulfonic acids; α-olefinsulfonic acids; alkylbenzenesulfonic acids; alkylnaphthalenesulfonic acids; alkyl ether sulfonic acids; alkylphenyl ether sulfonic acids; alkyl diphenyl ether sulfonic acids; sulfosuccinic acid; dialkylsulfosuccinic acids; methyltauric acid; β-naphthalenesulfonic acid; condensates of formaline; poly-acrylic acid; polyvinylsulfonic acid; polymethacrylic acid; polystyrenesulfonic acid; polyhydroxyethyl methacrylate; polyvinyl alcohol; polyvinyl alcohol copolymers; partial saponification products of polyvinyl acetate; partial saponification products of vinyl acetate copolymers; ethyleneimine; polyethyleneimine; polyethylene oxide; polypropylene oxide; polyethylene oxide-polypropylene oxide copolymers; polyvinyl methyl ether; polyvinyl methyl ether copolymers; pyrrolidone; polyN-vinylpyrrolidone; polyvinyloxazoline; polyacrylamide; polyacrylamide copolymers; lauryltrimethylamine; and EDTA. Among these compounds, aliphatic primary amines, polyethyleneimine, lauryltrimethylamine, and compounds having a substituted ammonium salt are particularly preferable. The aqueous solutions described above may be used singly or as a combination of two or more types.

The condition of process (2) is not particularly limited. It is preferred that the process is conducted at a temperature in the range of a room temperature to 60° C. for 5 seconds to 20 minutes, more preferably 10 seconds to 10 minutes. When the process of providing polarity is not conducted, the surface is not easily provided with the catalyst for the chemical plating in the next process, and a plating film is not easily formed by the chemical plating either. Therefore, it sometimes occurs that the desired plated molded article is not obtained.

The process of providing the catalyst for chemical plating of process (3) is conducted to promote the chemical plating in the next process. The process for providing the catalyst for chemical plating is not particularly limited, and a process conventionally used in plating plastic molded articles can be used. For example, the following processes can be used. In one of such processes, a negatively charged colloid of stannous chloride and palladium chloride is used as the catalyst particles. A colloidal substance containing tin and palladium is precipitated on the surface of the molded article which has been provided with polarity in above process (2) by the catalyzing treatment, and then tin is removed from the precipitated substance while palladium is left remaining by the acceleration treatment to provide the surface with the catalyst for chemical plating (the metal catalyst). In another of such processes, the sensitizing treatment (the treatment of providing sensitivity) is conducted, for example, by dipping the molded article which has been provide with polarity in process (2) into a solution of stannous chloride, and ionic tin having a reducing ability is adsorbed on the surface of the molded article in this treatment. Then, the sensitized molded article is treated by the activation treatment in which, for example, the sensitized molded article is dipped into a solution of palladium chloride to precipitate palladium by the action of tin adsorbed on the surface. Thus, the surface is provided with the catalyst for chemical plating (the metal catalyst).

In the process of chemical plating of process (4), a metal ion is precipitated by reduction on the surface of the molded article which has been treated with the process of providing catalyst for chemical plating in process (3), and a film of the metal is formed. The process of chemical plating is not particularly limited, and a process conventionally used in plating plastic molded articles can be used. For example, a plating film of copper or a plating film of nickel can be formed on the surface of the molded article which has been treated with the chemical plating in process (3) by dipping the molded article into an aqueous solution of a copper salt or a nickel salt containing a reducing agent at about 10 to 50° C. for 2 to 20 minutes.

Moreover, the process of electric plating of process (5) may sometimes be conducted depending on the application.

Because the plating film formed by the above chemical plating of process (4) is thin and has a rather small strength, the film formed by the chemical plating is reinforced by the electric plating in this process. The plating film formed by the electric plating may be a single layer film or a multi-layer film composed of a plurality of metal films. In view of decorativeness in designing, strength, and life, a multi-layer film having a chromium plating film as the outermost layer is preferred. As the multi-layer film, for example, a multi-layer film prepared by successively forming a copper plating film, a nickel plating film, and a chromium plating film by the electric plating is preferable. The process of the electric plating is not particularly limited, and a process conventionally used in plating plastic molded articles can be used. The molded article may have the chemical plating alone without the electric plating depending on the application.

When SPS is used, a plated molded article having a still higher adhesive strength of the plating film can be obtained by drying the plated molded article in process (6). The process of drying is not particularly limited, and a conventional process can be used. The drying process is preferably conducted at 60 to 150° C. for about 10 seconds to 60 minutes.

In accordance with the process described above, a plated molded article containing SPS which suppresses skipped plating and has a high adhesive strength of the plating film can efficiently be obtained. More specifically, a plated molded article generally having a peeling strength, an index showing the adhesive strength of the plating film, of 0.5 kg/cm or more, preferably 0.6 kg/cm or more, more preferably 0.8 kg/cm, most preferably 1.0 kg/cm, can be obtained by the present invention.

The present invention is described in more detail with reference to examples. However, the present invention is not limited by the examples.

For evaluation of the mechanical properties, the following properties were measured by using test pieces obtained in the examples and comparative examples.

(1) Peeling Strength

A plating film of a width of 10 mm and a length of 60 mm was peeled off at a constant speed (50 mm/min) in a direction perpendicular to a plated surface to measure the average peeling strength.

(2) Cross-Cut Peeling Test

In accordance with the testing method of a tape of Japanese Industrial Standard H8630, the surface of a plating film was cut into grids (100 grid elements of 1 mm square), and the peeling test of the plating film was conducted by using a cellophane tape. The adhesive strength was evaluated by the number of peeled grid elements in the original 100 grid elements in accordance with the following criterion:

⊚: 0/100

◯: 1~5/100

Δ: 6~10/100

×: 11~100/100

(3) Heat Cycle Test

A sample was subjected to the following heat treatment: a room temperature→90° C., 1 hour→a room temperature, 30 minutes→30° C., 1 hour→90° C., 1 hour→a room temperature, 30 minutes→−30° C., 1 hour→90° C., 1 hour→a room temperature, 30 minutes→−30° C., 1 hour→a room temperature ⊚: no change in appearance ◯: swelling of a shape of isolated particles (diameter of less than 3 mm)

Δ: partial swelling and peeling (diameter of larger than 3 mm)

×: swelling and peeling extended to the whole surface (4) Crystallinity at the Surface Part A surface part of a molded article having a thickness of 100 μm was cut out by using a microtome. The obtained sample was examined by using a DSC (a product of Perkin Elmer Corporation, DSC7) by increasing the temperature from 50° C. to 300° C. at a rate of 20° C./min. The area of an exothermic peak observed at about 100 to 170° C. and the area of an endothermic peak observed at about 240 to 270° C. were measured. The crystallinity was obtained from these values in accordance with the method described above.

(5) Determination of the Ratio of the Length of the Major Axis to the Length of the Minor Axis and Measurement of the Length of the Major Axis of a Domain at the Surface of a Molded Article within a Depth of 50 μm from the Surface A surface of a molded article in the direction of the flow of the material was exposed by using a glass knife. Twenty parts of the molded article arbitrarily selected in the part within 50 μm from the surface were observed by a scanning electron microscope. With each domain in the selected parts, the ratio of the length of the major axis to the length of the minor axis of the domain was measured. The average of the obtained values with respect to the domains in the selected parts was regarded as the ratio of the length of the major axis to the length of the minor axis of the domain at the surface of the molded article. In the same manner, the length of the major axis was measured at 20 parts of the molded article, and the average of the obtained lengths of the major axis was regarded as the length of the major axis of the domain at the surface of the molded article.

(6) The average Particle Diameter and the Coefficient of Variation of the Particle Diameter of an Inorganic Compound Soluble in an Oxidizing Agent The average particle diameter and the coefficient of variation of the particle diameter were measured by using Microtrack Particle Size Analyzer, Type 7991, a product of Leeds & Northrup Corporation.

The condition of the measurement: the range of the measurement of 0.12 to 704.00 μm.

PREPARATION EXAMPLE 1

(Preparation of SPS Type 1)

Into a 2 liter reactor, 1.0 liter of purified styrene and 1 mmol of triethylamuminum were placed. After the resultant mixture was heated to 75° C., 16.5 ml of a preliminary mixed catalyst [90 micromol of pentamethylcyclopentadienyltitanium trimethoxide, 90 micromol of dimethylanilinium tetrakis(pentafluorophenyl) borate, 29.1 mmol of toluene, and 1.8 mmol of triisobutylaluminum] was added to the mixture, and polymerization was allowed to proceed at 75° C. for 4.8 hours. After the reaction was finished, the reaction product was repeatedly washed with methanol and dried to obtain 380 g of a polymer.

The molecular weight of the obtained polymer was measured by the gel permeation chromatography using 1,2,4-trichlorobenzene as the solvent at 130° C. and found to be 272,000. The ratio of the weight-average molecular weight to the number-average molecular weight was 2.50. By the measurements of the melting point and the $^{13}$C-NMR, the obtained polymer was confirmed to be SPS (This SPS is referred to as "SPS 1" hereinafter).

PREPARATION EXAMPLE 2

(Preparation of SPS Type 2)

In the first step, under a nitrogen atmosphere, 38.32 ml of toluene was mixed with 0.12 mmol of pentamethylcyclopentadienyltitanium trimethoxide, 96 mg of dimethylanilinium tetra(pentafluorophenyl) borate, and 2.4 mmol of triisobutylaluminum to prepare a mixed catalyst of the total volume of 40 ml.

In the next step, into a reactor having an inner volume of 3 liter and purged with nitrogen, 1.0 liter of purified styrene and 0.40 mmol of triethylaluminum (TEA) were placed, and the resultant mixture was heated to 85° C. To the heated mixture, 125 ml of the mixed catalyst prepared in the first step was added, and at the same time, hydrogen was supplied until the partial pressure reached 0.10 MPa. The polymerization of the obtained mixture was allowed to proceed for 4 hours. As the result of the polymerization, 398 g of a polymer was obtained after drying. By the measurements of the melting point and the $^{13}$C-NMR, the obtained polymer was confirmed to be SPS.

The weight-average molecular weight of the obtained polymer was measured by the same method as that used in Preparation Example 1 and found to be 160,000. The ratio of the weight-average molecular weight to the number-average molecular weight was 2.52. (This SPS is referred to as "SPS 2" hereinafter.)

PREPARATION EXAMPLE 3

(Preparation of SPS Type 3)

By the same procedures as those used in Preparation Example 2 except that the set temperature of polymerization was 70° C., the partial pressure of hydrogen was 0.05 MPa, and 0.2 mmol of TEA was placed, 426 g of SPS was obtained. The weight-average molecular weight of the obtained SPS was found to be 420,000. The ratio of the weight-average molecular weight to the number-average molecular weight was 2.46. (This SPS is referred to as "SPS 3" hereinafter).

PREPARATION EXAMPLE 4

(Preparation of SPS Type 4)

By the same procedures as those used in Preparation Example 2 except that the partial pressure of hydrogen was 0.05 MPa, 357 g of SPS was obtained, and the obtained polymer was confirmed to be SPS. The molecular weight and the ratio of the weight-average molecular weight to the number-average molecular weight were measured by the same methods as those used in Preparation Example 2. The weight-average molecular weight of the obtained SPS was 200,000, and the ratio of the weight-average molecular weight to the number-average molecular weight was 2.52. (This SPS is referred to as "SPS 4" hereinafter).

PREPARATION EXAMPLE 5

(Preparation of SPS Type 5)

By the same procedures as those used in Preparation Example 2 except that the partial pressure of hydrogen was 0.05 MPa and the set temperature was 70° C., 396 g of SPS was obtained.

The weight-average molecular weight of the obtained polymer was measured by the same method as that used in Preparation Example 1 and found to be 310,000. (This SPS is referred to as "SPS 5" hereinafter).

PREPARATION EXAMPLE 6

(Preparation of SPS Type 6)

The same procedures as those used in Preparation Example 2 except that 0.30 mmol of triethylaluminum (TEA) was used, and the polymerization temperature was 70° C. were conducted.

The weight-average molecular weight of the obtained polymer was measured by the same method as that used in Preparation Example 1 and found to be 350,000. (This SPS is referred to as "SPS 6" hereinafter).

PREPARATION EXAMPLE 7
(Preparation of PPE Modified with Fumaric Acid)

Polyphenylene ether (inherent viscosity in chloroform at 25° C., 0.45 dl/g) in an amount of 1 kg, 80 g of fumaric acid, and 20 g of 2,3-dimethyl-2,3-diphenylbutane (a product of Nippon Oils & Fats Co., Ltd.; trade name, Nofmer BC) as the radical generator were dry blended, and the mixture was melt kneaded by a 30 mm twin screw extruder at a rotation speed of screw of 200 rpm at a set temperature of 300° C. During the melt kneading, the temperature of the resin was about 330° C. The obtained strands of the mixture was cooled and pelletized to obtain a polyphenylene ether modified with fumaric acid. (This polymer is referred to as "FAPPE 1" hereinafter.) To obtain the degree of modification, 1 g of the modified polyphenylene ether obtained above was dissolved in ethylbenzene and then reprecipitated with methanol. The recovered polymer was extracted with methanol by a Soxhlet extractor and dried. The degree of modification was obtained from the absorption of the carbonyl group in the infrared spectrum of the obtained polymer and also by the titration of the obtained polymer and found to be 1.6% by weight.

PREPARATION EXAMPLE 8
(Preparation of PPE Modified with Fumaric Acid)

By the same procedures as those used in Preparation Example 7 except that 30 g of fumaric acid was used, a polyphenylene ether modified with fumaric acid was obtained. (This polymer is referred to as "FAPPE 2" hereinafter).

The degree of modification was measured by the same method as that used in Preparation Example 7 and found to be 1.5% by weight.

The polymers and the other ingredients used in the examples are listed in the following together with the abbreviations for the polymers and the other ingredients used.

SEBS 1, SEBS 2, and SEBS 3: hydrogenated styrene-butadiene-diene-styrene diblock copolymers
    SEBS 1: a product of Kuraray Co., Ltd.; Septon KL8006
    SEBS 2: a product of Asahi Chemical Industry Co., Ltd.; H-1081
    SEBS 3: a product of Shell Chemical Co., Ltd.; G-1652

EPR: ethylene-propylene rubber, a product of Japan Synthetic Rubber Co., Ltd.; EP-07P core-shell rubber 1: a product of Mitsubishi Rayon Co., Ltd.; Metablen S-2001 core-shell rubber 2: a product of Mitsubishi Rayon Co., Ltd.; Metablen C-132 core shell rubber 3: a product of Mitsubishi Rayon Co., Ltd.; Metablen E-970

MASEBS: SEBS modified with maleic anhydride; a product of Asahi Chemical Industry Co., Ltd.; M-1962

PP: polypropylene; a product of Idemitsu Petrochemical Co., Ltd.; E-185G

HDPE: high density polyethylene; a product of Idemitsu Petrochemical Co., Ltd.; 440UF PC: polycarbonate; a product of Idemitsu Petrochemical Co., Ltd.; FN-2200

PBT: polybutylene terephthalate; a product of Polyplastics Co., Ltd.; 2002

TPX: poly(4-methylpentene-1); a product of Mitsui Petrochemical Co., Ltd.; DX-845

$CaCO_3$ 1: calcium carbonate; a product of Shiraishi Kogyo Co., Ltd.; Whiton P-30

$CaCO_3$ 2: calcium carbonate; a product of Maruo Calcium Co., Ltd.; Super SS $CaCO_3$ 3: calcium carbonate; a product of Maruo Calcium Co., Ltd.; MSK-PO $CaCO_3$ 4: calcium carbonate; a product of Maruo Calcium Co., Ltd.; Nanox #30

GF: glass fiber; a product of Asahi Fiber Glass Co., Ltd.; 03JA-FT712

PPE 1: polyphenylene ether; inherent viscosity $[\eta]=0.47$ dl/g (25° C., in chloroform)

PPE 2: polyphenylene ether; inherent viscosity $[\eta]=0.45$ dl/g (25° C., in chloroform)

nucleating agents:
    NA-11; a product of Asahi Denka Co., Ltd.
    NA-21; a product of Asahi Denka Co., Ltd.
    PTBBA-A1; a product of Dainippon Ink & Chemical Industry Co., Ltd.
    talc; FFR; a product of Asada Flour Milling Co., Ltd.

plasticizer: polyethylene glycol; PEG-1000DM; a product of Asahi Denka Co., Ltd.

antioxidant:
    Irganox 1010; a product of Ciba Geigy Co.
    PEP-36; a product of Asahi Denka Co., Ltd.

The above abbreviations are used in the following tables and descriptions unless otherwise mentioned.

EXAMPLES 1 TO 36, COMPARATIVE EXAMPLES 1 TO 4, AND REFERENCE EXAMPLE 1

The components of the types shown in Table 1 in the amounts also shown in Table 1 were melt kneaded by using a twin screw extruder at 300° C. to prepare materials for molding. The prepared materials were injection molded to prepare flat plates having a width of 80 mm, a length of 80 mm, and a thickness of 3 mm. The obtained plates were plated by the steps shown in Tables 2 and 3. The plated products were subjected to the peeling strength test, the cross-cut peeling test, and the heat cycle test. The results are shown in Table 4.

TABLE 1-a(1)

| component of resin composition for molding | (A) SPS 1 % by wt. | (B) substance soluble in an oxidizing agent | | | |
|---|---|---|---|---|---|
| | | component (a) of (B) | | component (b) of (B) | |
| | | type | % by wt. | type | % by wt. |
| Example 1 | 80 | — | — | — | — |
| Example 2 | 80 | SEBS 1 | 20 | — | — |

TABLE 1-a(1)-continued

| component of resin composition for molding | (A) SPS 1 % by wt. | (B) substance soluble in an oxidizing agent | | | |
|---|---|---|---|---|---|
| | | component (a) of (B) | | component (b) of (B) | |
| | | type | % by wt. | type | % by wt. |
| Example 3 | 70 | SEBS 1 | 20 | — | — |
| Example 4 | 80 | core-shell rubber 1 | 20 | — | — |
| Example 5 | 70 | core-shell rubber 1 | 20 | — | — |
| Example 6 | 76 | — | — | — | — |
| Example 7 | 76 | SEBS 1 | 24 | — | — |
| Example 8 | 64 | SEBS 1 | 24 | — | — |
| Example 9 | 16 | core-shell rubber 1 | 24 | — | — |
| Example 10 | 64 | core-shell rubber 1 | 24 | — | — |
| Example 11 | 79 | SEBS 1 MASEBS | 17 4 | — | — |
| Example 12 | 69 | SEBS1 MASEBS | 17 4 | — | — |
| Example 13 | 45 | — | — | HDPE | 40 |
| Example 14 | 75 | — | — | — | — |
| Example 15 | 45 | — | — | PBT | 40 |
| Example 16 | 45 | — | — | TPX | 40 |

TABLE 1-a(2)

| component of resin composition for molding | (B) substance soluble in an oxidizing agent component (c) of (B) | | component (C) GF | component (D) FAPPE 1 | other components |
|---|---|---|---|---|---|
| | type | % by wt. | pt. by wt. | pt. by wt. | pt. by wt. |
| Example 1 | CaCO$_3$ 1 | 20 | — | — | — |
| Example 2 | — | — | — | — | — |
| Example 3 | CaCO$_3$ 1 | 10 | — | — | — |
| Example 4 | — | — | — | — | — |
| Example 5 | CaCO$_3$ 1 | 10 | — | — | — |
| Example 6 | CaCO$_3$ 1 | 24 | 18 | 4 | — |
| Example 7 | — | — | 18 | 4 | — |
| Example 8 | CaCO$_3$ 1 | 12 | 18 | 4 | — |
| Example 9 | — | — | 18 | 4 | — |
| Example 10 | CaCO$_3$ 1 | 12 | 18 | 4 | — |
| Example 11 | — | — | — | — | PPE1 4 |
| Example 12 | CaCO$_3$ 1 | 10 | — | — | PPE1 4 |
| Example 13 | CaCO$_3$ 1 | 15 | — | — | — |
| Example 14 | CaCO$_3$ 1 | 25 | — | — | PC 67 |
| Example 15 | CaCO$_3$ 1 | 15 | — | — | — |
| Example 16 | CaCO$_3$ 1 | 15 | — | — | — |

TABLE 1-b(1)

| component of resin composition for molding | (A) SPS 7 type % by wt. | (B) substance soluble in an oxidizing agent | | | |
|---|---|---|---|---|---|
| | | component (a) of (B) | | component (b) of (B) | |
| | | type | % by wt. | type | % by wt. |
| Example 17 | — 80 | EPR SEBS 2 | 15 5 | — | — |
| Example 18 | — 80 | — SEBS 2 | — 5 | PP | 15 |
| Example 19 | — 80 | — | — | — | — |

TABLE 1-b(1)-continued

| component of resin composition for molding | (A) SPS 7 type | (A) SPS 7 % by wt. | (B) substance soluble in an oxidizing agent component (a) of (B) type | (B) substance soluble in an oxidizing agent component (a) of (B) % by wt. | (B) substance soluble in an oxidizing agent component (b) of (B) type | (B) substance soluble in an oxidizing agent component (b) of (B) % by wt. |
|---|---|---|---|---|---|---|
| Example 20 | — | 75 | EPR SEBS 2 | 10 5 | PP | 10 |
| Example 21 | — | 70 | — SEBS 2 | — 5 | PP | 15 |
| Example 22 | — | 70 | EPR SEBS 2 | 15 5 | — | — |
| Example 23 | — | 70 | EPR SEBS 2 | 10 5 | PP | 10 |
| Example 24 | — | 80 | EPR SEBS 2 | 15 5 | — | — |
| Example 25 | — | 80 | EPR SEBS 2 | 15 5 | — | — |
| Example 26 | — | 80 | — SEBS 2 | — 5 | PP | 15 |
| Example 27 | — | 80 | — | — | — | — |
| Example 28 | — | 75 | EPR SEBS 2 | 10 5 | PP | 10 |
| Example 29 | — | 70 | — SEBS 2 | 10 5 | PP | 15 |
| Example 30 | — | 70 | EPR SEBS 2 | 15 5 | — | — |
| Example 31 | — | 70 | EPR SEBS 2 | 10 5 | PP | 10 |

TABLE 1-b(2)

| component of resin composition for molding | (B) substance soluble in an oxidizing agent component (c) of (B) type | (B) substance soluble in an oxidizing agent component (c) of (B) % by wt. | component (C) GF pt. by wt. | component (D) FAPPE 1 pt. by wt. |
|---|---|---|---|---|
| Example 17 | — | — | — | — |
| Example 18 | — | — | — | — |
| Example 19 | CaCO$_3$ 1 | — | — | — |
| Example 20 | — | — | — | — |
| Example 21 | CaCO$_3$ 1 | 10 | — | — |
| Example 22 | CaCO$_3$ 1 | 10 | — | — |
| Example 23 | CaCO$_3$ 1 | 5 | — | — |
| Example 24 | — | — | 40 | — |
| Example 25 | — | — | 40 | 3 |
| Example 26 | — | — | 40 | 3 |
| Example 27 | CaCO$_3$ 1 | 20 | 40 | 3 |
| Example 28 | — | — | 40 | 3 |
| Example 29 | CaCO$_3$ 1 | 10 | 40 | 3 |
| Example 30 | CaCO$_3$ 1 | 10 | 40 | 3 |
| Example 31 | CaCO$_3$ 1 | 5 | 40 | 3 |

TABLE 1-c(1)

| component of resin composition for molding | (A) SPS type | (A) SPS % by wt. | (B) substance soluble in an oxidizing agent component (a) of (B) type | (B) substance soluble in an oxidizing agent component (a) of (B) % by wt. | (B) substance soluble in an oxidizing agent component (b) of (B) type | (B) substance soluble in an oxidizing agent component (b) of (B) % by wt. |
|---|---|---|---|---|---|---|
| Example 32 | SPS 6 | 80 | SEBS 1 MASEBS | 15 5 | — — | — — |
| Example 33 | SPS 4 | 90 | SEBS 1 | 10 | — | — |
| Example 34 | SPS 4 | 80 | SEBS 1 | — | — | — |
| Example 35 | SPS 4 | 70 | SEBS 1 | — | — | — |
| Example 36 | SPS 4 | 70 | core-shell rubber 1 | — | — | — |
| Comparative Example 1 | SPS 4 | 100 | — | — | — | — |

TABLE 1-c(1)-continued

| component of resin composition for molding | (A) SPS type | % by wt. | (B) substance soluble in an oxidizing agent component (a) of (B) type | % by wt. | component (b) of (B) type | % by wt. |
|---|---|---|---|---|---|---|
| Comparative Example 2 | SPS 4 | 100 | — | — | — | — |
| Comparative Example 3 | SPS 4 | 100 | — | — | — | — |
| Comparative Example 4 | SPS 4 | 100 | — | — | — | — |
| Reference Example 1 | SPS 7 | 70 | core-shell rubber 1 | 20 | — | — |

TABLE 1-c(2)

| component of resin composition for molding | (B) substance soluble in an oxidizing agent component (c) of (B) type | % by wt. | component (C) GF pt. by wt. | component (D) FAPPE 1 pt. by wt. | other component (PPE 1) pt. by wt. |
|---|---|---|---|---|---|
| Example 32 | — | — | — | — | 5 |
| Example 33 | — | — | 40 | 3 | — |
| Example 34 | — | — | 20 | 3 | — |
| Example 35 | CaCO$_3$ 1 | 10 | 20 | 3 | — |
| Example 36 | CaCO$_3$ 1 | 10 | 20 | 3 | — |
| Comparative Example 1 | — | — | — | — | — |
| Comparative Example 2 | — | — | — | 5 | — |
| Comparative Example 3 | — | — | 20 | — | — |
| Comparative Example 4 | — | — | 20 | 3 | — |
| Reference Example 1 | CaCO$_3$ 1 | 10 | — | — | — |

The amounts of components (C) and (D) and the nucleating agent are shown in parts by weight based on 100 parts by weight of the total of components (A) and (B).

In all these compositions, antioxidants Irganox 1010 and PEP-36 each in an amount of 0.1 part by weight based on 100 parts by weight of the total of component (A) and component (B) were additionally comprised. In Examples 17 to 23, 25 to 36, 40 to 45, 53 to 61, 68 and 70, in all the comparative examples, and in all the reference examples, NA-11 as the nucleating agent in an amount of 0.5 parts by weight based on 100 parts by weight of the total of component (A) and component (B) were additionally comprised.

TABLE 2

| step | treatment agent | used amount | condition of treatment temperature (° C.) | time (min) |
|---|---|---|---|---|
| 1. defatting | | | 50 | 5 |
| 2. washing with water | | | | |
| 3. etching | CrO$_3$ | 400 g/l | 70 | 5 |
| | H$_2$SO$_4$ 97% by wt. | 400 g/l | | |
| 4. washing with water | | | | |
| 5. neutralization and reduction | HCl 36% by wt. | 10 ml/l | room temp. | 2 |
| | H$_2$O$_2$ 30% by wt. | 10 ml/l | | |
| 6. providing polarity | 2% by wt. aq. soln. of polyethyleneimine | 10 ml/l | 40 | 1 |
| 7. catalyzing | HCl 36% by wt. | 100 ml/l | 35 | 3 |
| | ENILEX CT[1)] | 50 ml/l | | |
| 8. washing with water | | | | |
| 9. accelerating | H$_2$SO$_4$ 97% by wt. | 100 ml/l | 35 | 2 |
| 10. washing with water | | | | |

TABLE 2-continued

| step | treatment agent | used amount | condition of treatment temperature (° C.) | time (min) |
|---|---|---|---|---|
| 11. chemical nickel plating | Omnishield 1580[2] | | 42 | 5 |
| 12. washing with water | | | | |
| 13. conditioning | PDC[3] | 10 ml/l | | |
| 14. washing with water | | | | |
| 15. electric copper plating | UBAC-Ep[4] | 3 A/dm$^2$ | 30 | 55 |
| 16. washing with water | | | | |
| 17. electric half-gloss nickel plating | BTL[5] | 4 A/dm$^2$ | 50 | 22 |
| 18. electric gloss nickel plating | #66[6] | 4 A/dm$^2$ | 50 | 20 |
| 19. washing with water | | | | |
| 20. electric chromium plating | K40[7] | 15 A/dm$^2$ | 40 | 3 |
| 21. washing with water | | | | |
| 22. drying | | | 80 | 60 |

1), 3) ~ 7) products of Ebara Ugilight Co., Ltd.
2) a product of Shiplay Far East Co., Ltd.

TABLE 3

| step | treatment agent | used amount | condition of treatment temperature (° C.) | time (min) |
|---|---|---|---|---|
| 1. defatting | | | 50 | 5 |
| 2. washing with water | | | | |
| 3. etching | CrO$_3$ | 400 g/l | 70 | 5 |
| | H$_2$SO$_4$ 97% by wt. | 400 g/l | | |
| 4. washing with water | | | | |
| 5. neutralization and reduction | HCl 36% by wt. | 10 ml/l | room temp. | 2 |
| | H$_2$O$_2$ 30% by wt. | 10 ml/l | | |
| 6. catalyzing | HCl 36% by wt. | 100 ml/l | 35 | 3 |
| | ENILEX CT[1] | 50 ml/l | | |
| 7. washing with water | | | | |
| 8. accelerating | H$_2$SO$_4$ 97% by wt. | 100 ml/l | 35 | 2 |
| 9. washing with water | | | | |
| 10. chemical nickel plating | Omnishield 1580[2] | | 42 | 5 |
| 11. washing with water | | | | |
| 12. conditioning | PDC[3] | 10 ml/l | | |
| 13. washing with water | | | | |
| 14. electric copper plating | UBAC-EP[4] | 3 A/dm$^2$ | 30 | 55 |
| 15. washing with water | | | | |
| 16. electric half-gloss nickel plating | BTL[5] | 4 A/dm$^2$ | 50 | 22 |
| 17. electric gloss nickel plating | #66[6] | 4 A/dm$^2$ | 50 | 20 |
| 18. washing with water | | | | |
| 19. electric chromium plating | K-40[7] | 15 A/dm$^2$ | 40 | 3 |
| 20. washing with water | | | | |
| 21. drying | | | 80 | 60 |

1), 3) ~ 7) products of Ebara Ugilight Co., Ltd.
2) a product of Shiplay Far East Co., Ltd.

TABLE 4-a

| | process of plating | peeling strength (kg/cm) | cross-cut peeling test | heat cycle |
|---|---|---|---|---|
| Example 1 | Table 2 | 1.4 | ⊚ | ○ |
| Example 2 | Table 2 | 1.4 | ⊚ | ○ |
| Example 3 | Table 2 | 1.3 | ⊚ | ○ |
| Example 4 | Table 2 | 1.2 | ⊚ | ○ |
| Example 5 | Table 2 | 1.5 | ⊚ | ⊚ |
| Example 6 | Table 2 | 1.3 | ⊚ | ⊚ |
| Example 7 | Table 2 | 1.3 | ⊚ | ⊚ |
| Example 8 | Table 2 | 1.3 | ○ | ○ |
| Example 9 | Table 2 | 1.2 | ○ | ○ |
| Example 10 | Table 2 | 1.4 | ○ | ⊚ |
| Example 11 | Table 2 | 1.3 | ○ | ⊚ |
| Example 12 | Table 2 | 1.5 | ○ | ⊚ |
| Example 13 | Table 2 | 1.5 | ○ | ⊚ |
| Example 14 | Table 2 | 1.2 | ○ | ⊚ |
| Example 15 | Table 2 | 1.3 | ○ | ⊚ |
| Example 16 | Table 2 | 1.2 | ○ | ⊚ |
| Example 17 | Table 2 | 1.4 | ⊚ | ⊚ |
| Example 18 | Table 2 | 1.3 | ⊚ | ⊚ |
| Example 19 | Table 2 | 1.4 | ⊚ | ⊚ |
| Example 20 | Table 2 | 1.2 | ⊚ | ⊚ |
| Example 21 | Table 2 | 1.0 | ⊚ | ⊚ |
| Example 22 | Table 2 | 1.4 | ⊚ | ⊚ |
| Example 23 | Table 2 | 1.3 | ⊚ | ⊚ |
| Example 24 | Table 2 | 1.4 | ⊚ | ⊚ |
| Example 25 | Table 2 | 1.5 | ⊚ | ⊚ |
| Example 26 | Table 2 | 1.3 | ⊚ | ⊚ |
| Example 27 | Table 2 | 1.4 | ⊚ | ⊚ |
| Example 28 | Table 2 | 1.5 | ⊚ | ⊚ |
| Example 29 | Table 2 | 1.5 | ⊚ | ⊚ |
| Example 30 | Table 2 | 1.2 | ⊚ | ⊚ |
| Example 31 | Table 2 | 1.3 | ⊚ | ⊚ |
| Example 32 | Table 2 | 1.0 | ⊚ | ⊚ |
| Example 33 | Table 2 | 1.0 | ⊚ | ⊚ |
| Example 34 | Table 2 | 1.0 | ⊚ | ⊚ |
| Example 35 | Table 2 | 1.0 | ⊚ | ⊚ |
| Example 36 | Table 2 | 1.4 | ⊚ | ⊚ |

TABLE 4-b

| | process of plating | peeling strength (kg/cm) | cross-cut peeling test | heat cycle |
|---|---|---|---|---|
| Comparative Example 1 | Table 2 | 0.1 | x | x |
| Comparative Example 2 | Table 2 | 0.1 | x | x |
| Comparative Example 3 | Table 2 | 0.1 | x | x |
| Comparative Example 4 | Table 2 | 0.1 | x | x |
| Reference Example 1 | Table 2 | 0.5 | Δ | Δ |

EXAMPLES 37 TO 45

Resin compositions were prepared in accordance with the formulations shown in Table 5. In all these compositions, antioxidants Irganox 1010 and PEP-36 each in an amount of 0.1 part by weight based on 100 parts by weight of the total of component (A) and component (B) were additionally comprised.

The obtained resin compositions were melt kneaded by using a twin screw extruder at 300° C., and the melt kneaded resin compositions were injection molded at a mold temperature of 80° C. or 150° C. to obtain flat plates having a width of 80 mm, a length of 80 mm, and a thickness of 3 mm. Some of the obtained plates were heat treated at 150° C. for 1 hour, and the rest of the obtained plates were not heat treated. The plates were then plated by the steps shown in Table 6 under the conditions also shown in Table 6 to obtain plated molded articles.

The plated molded articles were subjected to the cross-cut peeling test, the peeling test, and the heat cycle test. The results are shown in Table 7.

TABLE 5-a

| component of resin composition for molding | (A) SPS type | (A) % by wt. | (B) substance soluble in an oxidizing agent component (a) of (B) type | component (a) of (B) % by wt. | component (b) of (B) type | component (b) of (B) % by wt. |
|---|---|---|---|---|---|---|
| Example 37 | SPS 1 | 75 | SEBS 1 | 20 | — | — |
| | | | MASEBS | 5 | | |
| Example 38 | SPS 1 | 69 | SEBS 2 | 4 | PP | 17 |
| Example 39 | SPS 1 | 79 | core shell rubber 1 | 21 | — | — |
| Example 40 | SPS 5 | 80 | SEBS2 | 5 | — | — |
| | | | EPR | 15 | | |
| Example 41 | SPS 5 | 80 | SEBS2 | 5 | — | — |
| | | | EPR | 15 | | |
| Example 42 | SPS 5 | 80 | SEBS2 | 5 | — | — |
| | | | EPR | 15 | | |
| Example 43 | SPS 5 | 80 | SEBS2 | 5 | — | — |
| | | | EPR | 15 | | |
| Example 44 | SPS 5 | 80 | SEBS2 | 5 | — | — |
| | | | EPR | 15 | | |
| Example 45 | SPS 5 | 80 | SEBS 2 | 5 | — | — |
| | | | EPR | 15 | | |

TABLE 5-b

| component of resin composition for molding | component (B) component (c) of (B) type | component (B) component (c) of (B) % by wt. | component (C) GF pt. by wt. | component (D) FAPPE 2 pt. by wt. | other components pt. by wt. | | |
|---|---|---|---|---|---|---|---|
| Example 37 | — | — | 19 | 5 | — | | |
| Example 38 | CaCO$_3$ 3 | 10 | — | — | PPE2 | 4 | |
| Example 39 | — | — | 40 | 4 | PPE2 | 4 | |
| | | | | | FFR | 0.5 | |
| Example 40 | — | — | 40 | 3 | NA-11 | 0.5 | |
| Example 41 | — | — | 40 | 3 | — | | |

TABLE 5-b-continued

| component of resin composition for molding | component (B) component (c) of (B) type | component (B) component (c) of (B) % by wt. | component (C) GF pt. by wt. | component (D) FAPPE 2 pt. by wt. | other components pt. by wt. |
|---|---|---|---|---|---|
| Example 42 | — | — |  | 3 | NA-11 0.5 PEG 2 |
| Example 43 | — | — | 40 | 3 | NA-11 0.5 |
| Example 44 | — | — | 40 | 3 | NA-11 0.5 |
| Example 45 | — | — | 40 | 3 | — |

TABLE 6

| step | treatment agent | treatment used amount | condition of treatment temperature (° C.) | condition of treatment time (min) |
|---|---|---|---|---|
| 1. defatting |  |  | 50 | 5 |
| 2. washing with water |  |  |  |  |
| 3. etching | CrO$_3$ | 400 g/l | 70 | 5 |
|  | H$_2$SO$_4$ 97% by wt. | 400 g/l |  |  |
| 4. washing with water |  |  |  |  |
| 5. neutralization and reduction | HCl 36% by wt. | 10 ml/l | room temp. | 2 |
|  | H$_2$O$_2$ 30% by wt. | 10 ml/l |  |  |
| 6. providing polarity | ENILEX NW[1)] | 10 ml/l | 40 | 1 |
| 7. catalyzing | HCl 36% by wt. | 100 ml/l | 35 | 3 |
|  | ENILEX CT[2)] | 50 ml/l |  |  |
| 8. washing with water |  |  |  |  |
| 9. accelerating | H$_2$SO$_4$ 97% by wt. | 100 ml/l | 35 | 2 |
| 10. washing with water |  |  |  |  |
| 11. chemical nickel plating | Omnishield 1580[3)] |  | 42 | 5 |
| 12. washing with water |  |  |  |  |
| 13. conditioning | PDC[4)] | 10 ml/l |  |  |
| 14. washing with water |  |  |  |  |
| 15. electric copper plating | UBAC-EP[5)] | 3 A/dm$^2$ | 30 | 55 |
| 16. washing with water |  |  |  |  |
| 17. electric half-gloss nickel plating | BTL[6)] | 4 A/dm$^2$ | 50 | 22 |
| 18. electric gloss nickel plating | #66[7)] | 4 A/dm$^2$ | 50 | 20 |
| 19. washing with water |  |  |  |  |
| 20. electric chrorniuin plating | K40[8)] | 15 A/dm$^2$ | 40 | 3 |
| 21. washing with water |  |  |  |  |
| 22. drying |  |  | 80 | 60 |

1), 2), 4) ~ 8) products of Ebara Ugilight Co., Ltd.
3) a product of Shiplay Far East Co., Ltd.

TABLE 7

| | mold temperature (° C.) | heat treatment | crystallinity (%) | peeling strength (kg/cm) | cross-cut peeling test | heat cycle |
|---|---|---|---|---|---|---|
| Example 37 | 150 | none | 38 | 1.6 | ⊚ | ⊚ |
| Example 38 | 150 | none | 35 | 1.7 | ⊚ | ⊚ |
| Example 39 | 80 | none | 31 | 1.7 | ⊚ | ⊚ |
| Example 40 | 150 | none | 40 | 1.2 | ⊚ | ⊚ |
| Example 41 | 150 | none | 30 | 0.9 | Δ | ○ |
| Example 42 | 150 | none | 45 | 1.7 | ⊚ | ⊚ |
| Example 43 | 80 | none | 30 | 0.9 | Δ | ○ |
| Example 44 | 80 | treated | 40 | 1.2 | ⊚ | ⊚ |
| Example 45 | 80 | none | 8 | 0.6 | Δ | Δ |

EXAMPLES 46 TO 52

Resin compositions were prepared in accordance with the formulations shown in Table 8. In all these compositions, antioxidants Irganox 1010 and PEP-36 each in an amount of 0.1 part by weight and NA-11 as the nucleating agent in an amount of 0.5 parts by weight based on 100 parts by weight of the total of component (A) and component (B) were additionally comprised.

The obtained resin compositions were melt kneaded by using a twin screw extruder at 290° C. to prepare pellets, and the prepared pellets were injection molded at a barrel temperature and a mold temperature set at the time of molding as shown in Table 8 to obtain flat plates having a width of 80 mm, a length of 80 mm, and a thickness of 3 mm. The obtained plates were plated by the steps shown in Table 9 to obtain plated molded articles.

The plated molded articles were subjected to the cross-cut peeling test, the peeling test, and the heat cycle test. The shape of domains in the vicinity of the surface of the molded articles was observed by a scanning electron microscope in the direction of the section. The results are shown in Table 10.

EXAMPLES 53 TO 61

Resin compositions were prepared in accordance with the formulations shown in Table 8. In all these compositions, antioxidants Irganox 1010 and PEP-36 each in an amount of 0.1 part by weight and NA-11 as the nucleating agent in an amount of 0.5 parts by weight based on 100 parts by weight of the total of component (A) and component (B) were additionally comprised.

The obtained resin compositions were melt kneaded by using a twin screw extruder at 290° C. to prepare pellets, and the prepared pellets were injection molded at a barrel temperature and a mold temperature set at the time of molding as shown in Table 8 to obtain flat plates having a width of 80 mm, a length of 80 mm, and a thickness of 3 mm. The obtained plates were plated by the steps shown in Table 9 to obtain plated molded articles.

The weight-average molecular weights of SPS in the obtained molded articles were measured. The plated molded articles were subjected to the cross-cut peeling test, the peeling test, and the heat cycle test. The shape of domains in the vicinity of the surface of the molded articles was observed by a scanning electron microscope in the direction of the section. The results are shown in Table 10.

TABLE 8-a(1)

| | (A) SPS | | (B) substance soluble in an oxidizing agent | | | | plasticizer |
| --- | --- | --- | --- | --- | --- | --- | --- |
| | | | component (a), (b) of (B) | | component (c) of (B) | | (PEG) |
| | SPS 2 | SPS 3 | | | | | |
| | % by wt. | % by wt. | type | % by wt. | type | % by wt. | pt. by wt. |
| Example 46 | 80 | — | core-shell rubber 1 | 20 | — | — | — |
| Example 47 | 80 | — | — | — | CaCO₃ 4 | 20 | — |
| Example 48 | 80 | — | SEBS 3 | 20 | — | — | — |
| Example 49 | 80 | — | EPR | 20 | — | — | — |
| Example 50 | 80 | — | PP | 20 | — | — | — |
| Example 51 | 78 | — | EPR | 20 | — | — | 2 |
| Example 52 | — | 78 | EPR | 20 | — | — | 2 |

TABLE 8-a(2)

| | mold temperature (° C.) | set barrel temperature (° C.) |
| --- | --- | --- |
| Example 46 | 80 | 285 |
| Example 47 | 80 | 285 |
| Example 48 | 80 | 285 |
| Example 49 | 80 | 285 |
| Example 50 | 80 | 285 |
| Example 51 | 80 | 285 |
| Example 52 | 80 | 285 |

TABLE 8-b(1)

| | (A) SPS | | (B) substance soluble in an oxidizing agent | | | |
| --- | --- | --- | --- | --- | --- | --- |
| | SPS 5 | SPS 3 | component (a) of (B) | | component (c) of (B) | |
| | % by wt. | % by wt. | type | % by wt. | type | % by wt. |
| Example 53 | 80 | — | EPR | 15 | — | — |
| | | | SEBS 2 | 5 | | |
| Example 54 | 80 | — | EPR | 15 | — | — |
| | | | SEBS 2 | 5 | | |
| Example 55 | 80 | — | EPR | 15 | — | — |
| | | | SEBS 2 | 5 | | |

TABLE 8-b(1)-continued

|  | (A) SPS | | (B) substance soluble in an oxidizing agent | | | |
|---|---|---|---|---|---|---|
|  | SPS 5 | SPS 3 | component (a) of (B) | | component (c) of (B) | |
|  | % by wt. | % by wt. | type | % by wt. | type | % by wt. |
| Example 56 | 80 | — | EPR | 15 | — | |
|  |  |  | SEBS 2 | 5 |  |  |
| Example 57 | — | 80 | EPR | 15 | — | |
|  |  |  | SEBS 2 | 5 |  |  |
| Example 58 | 80 | — | core-shell rubber 1 | 20 | — | |
| Example 59 | 80 | — | — | — | CaCO$_3$ 4 | |
| Example 60 | 80 | — | EPR | 20 | — | |
| Example 61 | — | 80 | EPR | 20 | — | |

TABLE 8-b(2)

|  | component (C) GF pt. by wt. | component FAPPE 1 pt. by wt. | plasticizer PEG pt. by wt. | mold temperature ° C. | set barrel temperature ° C. |
|---|---|---|---|---|---|
| Example 53 | 40 | 3 | — | 150 | 300 |
| Example 54 | 40 | 3 | 2 | 150 | 300 |
| Example 55 | 40 | 3 | — | 80 | 300 |
| Example 56 | 40 | 3 | — | 150 | 270 |
| Example 57 | 40 | 3 | — | 150 | 300 |
| Example 58 | 40 | 3 | — | 150 | 300 |
| Example 59 | 40 | 3 | — | 150 | 300 |
| Example 60 | 40 | 3 | — | 150 | 300 |
| Example 61 | 40 | 3 | — | 80 | 270 |

TABLE 9

|  |  |  | condition of treatment | |
|---|---|---|---|---|
| step | treatment agent | used amount | temperature (° C.) | time (min) |
| 1. defatting |  |  | 50 | 5 |
| 2. washing with water |  |  |  |  |
| 3. etching | CrO$_3$ | 400 g/l | 70 | 15 |
|  | H$_2$SO$_4$ 97% by wt. | 400 g/l |  |  |
| 4. washing with water |  |  |  |  |
| 5. neutralization and reduction | HCl 36% by wt. | 10 ml/l | room temp. | 2 |
|  | H$_2$O$_2$ 30% by wt. | 10 ml/l |  |  |
| 6. providing polarity | ENILEX NW[1)] | 10 ml/l | 40 | 1 |
| 7. catalyzing | HCl 36% by wt. | 100 ml/l | 35 | 3 |
|  | ENILEX CT[2)] | 50 ml/l |  |  |
| 8. washing with water |  |  |  |  |
| 9. accelerating | H$_2$SO$_4$ 97% by wt. | 100 ml/l | 35 | 2 |
| 10. washing with water |  |  |  |  |
| 11. chemical nickel plating | Omnishield 1580[3)] |  | 42 | 5 |
| 12. washing with water |  |  |  |  |
| 13. conditioning | PDC[4)] | 10 ml/l |  |  |
| 14. washing with water |  |  |  |  |
| 15. electric copper plating | WBAC-EP[5)] | 3 A/dm$^2$ | 30 | 55 |
| 16. washing with water |  |  |  |  |
| 17. electric half-gloss nickel plating | BTL[6)] | 4 A/dm$^2$ | 50 | 22 |
| 18. electric gloss nickel plating | #66[7)] | 4 A/dm$^2$ | 50 | 20 |
| 19. washing with water |  |  |  |  |
| 20. electric chromium plating | KAO[8)] | 15 A/dm$^2$ | 40 | 3 |
| 21. washing with water |  |  |  |  |
| 22. drying |  |  | 80 | 60 |

1), 2), 4) ~ 8) products of Ebara Ugilight Co., Ltd.
3) a product of Shiplay Far East Co., Ltd.

TABLE 10-a

| | shape of domain | | | peeling strength kg/cm | cross-cut peeling | heat cycle |
|---|---|---|---|---|---|---|
| | length of major axis μm | length of minor axis μm | major/ minor ratio | | | |
| Example 46 | 0.32 | 0.30 | 1.07 | 1.4 | ⊚ | ⊚ |
| Example 47 | 1.8 | 1.5 | 1.20 | 1.5 | ⊚ | ⊚ |
| Example 48 | 1.98 | 0.43 | 4.60 | 1.2 | ○ | ○ |
| Example 49 | 5.80 | 1.63 | 3.56 | 1.1 | Δ | ○ |
| Example 50 | 6.23 | 1.74 | 3.58 | 1.2 | Δ | ○ |
| Example 51 | 2.34 | 1.08 | 2.17 | 1.6 | ⊚ | ⊚ |
| Example 52 | 2.42 | 0.97 | 2.49 | 1.5 | ⊚ | ⊚ |

Note: major/minor ratio: ratio of the length of the major axis to the length of the minor axis TABLE 10-b

| | wt. – av. mol. wt. of SPS in molded article | shape of domain | | peeling strength kg/cm | cross-cut peeling | heat cycle |
|---|---|---|---|---|---|---|
| | | length of major axis μm | major/ minor ratio | | | |
| Example 53 | 300,000 | 7 | 7 | 1.2 | ⊚ | ⊚ |
| Example 54 | 300,000 | 5 | 3 | 1.7 | ⊚ | ⊚ |
| Example 55 | 300,000 | 20 | 7 | 0.8 | Δ | ○ |
| Example 56 | 300,000 | 18 | 8 | 0.8 | Δ | ○ |
| Example 57 | 410,000 | 18 | 7 | 0.8 | Δ | ○ |
| Example 58 | 300,000 | 1 | 0.3 | 1.7 | ⊚ | ⊚ |
| Example 59 | 300,000 | 1 | 4 | 1.7 | ⊚ | ⊚ |
| Example 60 | 300,000 | 20 | 7 | 0.8 | Δ | ○ |
| Example 61 | 410,000 | 25 | 10 | 0.6 | Δ | Δ |

Note: major/minor ratio: ratio of the length of the major axis to the length of the minor axis

EXAMPLES 62 TO 68 AND REFERENCE EXAMPLE 2

Resin compositions were prepared in accordance with the formulations shown in Table 11. In all these compositions, antioxidants Irganox 1010 and PEP-36 each in an amount of 0.1 part by weight and NA-11 as the nucleating agent in an amount of 0.5 parts by weight based on 100 parts by weight of the total of component (A) and component (B) were additionally comprised.

The particulate elastomers soluble in an oxidizing agent which were used in the above resin compositions were core-shell rubber 1 (Metablen S-2001; average particle diameter, 0.2 to 0.3 μm), core-shell rubber 2 (Metablen C-132; average particle diameter, 0.08 am), and core-shell rubber 3 (Metablen E-970; average particle diameter, 0.8 μm).

The obtained resin compositions were melt kneaded by using a twin screw extruder at 300° C.

The kneaded resin compositions were injection molded to prepare a flat plate having a width of 80 mm, a length of 80 mm, and a thickness of 3 mm, at a mold temperature of 50° C. The obtained molded articles were plated by the steps shown in Table 9 to obtain plated molded articles.

The plated molded articles were subjected to the cross-cut peeling test, the peeling test, and the heat cycle test. The results are shown in Table 12.

TABLE 11-a

| | (A) SPS 1 | component (a) of (B) | | | | |
|---|---|---|---|---|---|---|
| | % by wt. | type | % by wt. | type | % by wt. | |
| Example 62 | 80 | core-shell rubber 2 | 20 | — | — | |
| Example 63 | 80 | core-shell rubber 1 | 20 | — | — | |
| Example 64 | 64 | core-shell rubber 1 | 24 | — | — | |
| Example 65 | 76 | core-shell rubber 1 | 12 | SEBS 1 | 12 | |
| Example 66 | 64 | core-shell rubber 1 | 12 | SEBS 1 MASEBS | 10 2 | |
| Example 67 | 64 | core-shell rubber 1 | 12 | SEBS 1 | 12 | |
| Example 68 | 80 | core-shell rubber 1 | 20 | — | — | |
| Reference Example 2 | 80 | core-shell rubber 3 | 20 | — | — | |

TABLE 11-b

| | component (c) of (B) | | component (C) GF | component (D) type/ |
|---|---|---|---|---|
| | type | % by wt. | pt. by wt. | pt. by wt. |
| Example 62 | — | — | — | — |
| Example 63 | — | — | — | — |
| Example 64 | CaCO₃2 | 12 | 18 | FAPPE 2/2 |
| Example 65 | — | — | 18 | FAPPE 2/2 |
| Example 66 | CaCO₃2 | 12 | 18 | FAPPE 2/2 |
| Example 67 | CaCO₃2 | 12 | 18 | FAPPE 2/2 |
| Example 68 | — | — | 40 | FAPPE 2/3 |
| Reference Example 2 | — | — | 40 | FAPPE 2/3 |

TABLE 12

| | peeling strength kg/cm | cross-cut peeling | heat cycle |
|---|---|---|---|
| Example 62 | 1.2 | ○ | ○ |
| Example 63 | 1.4 | ⊚ | ○ |
| Example 64 | 1.6 | ⊚ | ⊚ |
| Example 65 | 1.5 | ⊚ | ⊚ |
| Example 66 | 1.7 | ⊚ | ⊚ |

TABLE 12-continued

| | peeling strength kg/cm | cross-cut peeling | heat cycle |
|---|---|---|---|
| Example 67 | 1.7 | ⊚ | ⊚ |
| Example 68 | 1.4 | ⊚ | ⊚ |
| Reference Example 2 | 0.5 | Δ | Δ |

EXAMPLE 69 AND REFERENCE EXAMPLES 3 TO 5

Resin compositions were prepared in accordance with the formulations shown in Table 13. In all these compositions, antioxidants Irganox 1010 and PEP-36 each in an amount of 0.1 part by weight and NA-11 as the nucleating agent in an amount of 0.5 parts by weight based on 100 parts by weight of the total of component (A) and component (B) were additionally comprised.

The obtained resin compositions were melt kneaded by using a twin screw extruder at 300° C., and then injection molded at a mold temperature of 80° C. to obtain flat plates having a width of 80 mm, a length of 80 mm, and a thickness of 3.0 mm. The obtained plates were plated by the steps shown in Table 9 to obtain plated molded articles.

The plated molded articles were subjected to the cross-cut peeling test, the peeling test, and the heat cycle test.

The results are shown in Table 14.

As the inorganic compound soluble in an oxidizing agent, the following compounds were used:

$CaCO_3$ 5: Super S (a product of Maruo Calcium Co., Ltd.; average particle diameter, 8.18 μm; coefficient of variation of particle diameter, 0.86)

$CaCO_3$ 6: Super SSS (a product of Maruo Calcium Co., Ltd.; average particle diameter, 5.27 μm; coefficient of variation of particle diameter, 0.85)

$CaCO_3$ 7: R Jutan (a product of Maruo Calcium Co., Ltd.; average particle diameter, 30.48 μm; coefficient of variation of particle diameter, 0.375)

$CaCO_3$ 8: Nanox #20 (a product of Maruo Calcium Co., Ltd.; average particle diameter, 3.13 μm; coefficient of variation of particle diameter, 0.74)

TABLE 13

| | (A) SPS 5 % by wt. | component (c) of (B) type | component (c) of (B) % by wt. | component (C) GF pt. by wt. | component (D) FAPPE 1 pt. by wt. |
|---|---|---|---|---|---|
| Reference Example 3 | 80 | $CaCO_3$5 | 20 | 40 | 3 |
| Reference Example 4 | 80 | $CaCO_3$6 | 20 | 40 | 3 |
| Reference Example 5 | 80 | $CaCO_3$7 | 20 | 40 | 3 |
| Example 69 | 80 | $CaCO_3$8 | 20 | 40 | 3 |

TABLE 14

| | physical properties | | |
|---|---|---|---|
| | peeling strength kg/cm | cross-cut peeling | heat cycle |
| Reference Example 3 | 0.5 | Δ | Δ |
| Reference Example 4 | 0.7 | Δ | Δ |
| Reference Example 5 | 0.6 | Δ | Δ |
| Example 69 | 1.4 | ⊚ | ⊚ |

EXAMPLE 70 AND REFERENCE EXAMPLE 6

Resin compositions were prepared in accordance with the formulations shown in Table 15. In these compositions, antioxidants Irganox 1010 and PEP-36 each in an amount of 0.1 part by weight and NA-11 as the nucleating agent in an amount of 0.5 parts by weight based on 100 parts by weight of the total of component (A) and component (B) were additionally comprised.

The obtained resin compositions were melt kneaded by using a twin screw extruder at 300° C., and then injection molded at a mold temperature of 80° C. to obtain two flat plates having a width of 80 mm, a length of 80 mm, and a thickness of 3.0 mm.

One of the obtained plates was kept under an absolute dry condition (in a desiccator containing silica gel and kept at 25° C.) for 7 days, and the other plate was kept in water (temperature of water, 25° C.) for 7 days. Both plates were then plated by the steps shown in Table 9 to obtain plated molded articles.

The plated molded articles were subjected to the cross-cut peeling test, the peeling test, and the heat cycle test.

Immediately before the two plates were plated, the content of water in the two plates were measured by the Karl Fischer method. The results are shown together in Table 10.

TABLE 15

| | (A) SPS 1 % by wt. | component (a) of (B) type | component (a) of (B) % by wt. | component (C) GF pt. by wt. | component (D) FAPPE 1 pt. by wt. |
|---|---|---|---|---|---|
| Example 70 | 70 | core-shell rubber 1 | 30 | 40 | 3 |
| Reference Example 6 | 70 | core-shell rubber 1 | 30 | 40 | 3 |

TABLE 16

| | condition under which plate is kept | content of water ppm | peeling strength kg/cm | cross-cut peeling | heat cycle |
|---|---|---|---|---|---|
| Example 70 | absolute dry | 1000 | 1.0 | ⊚ | ⊚ |
| Reference Example 6 | in water | 5000 | 0.6 | Δ | = |

INDUSTRIAL APPLICABILITY

The plated molded article containing SPS which shows suppressed skipped plating, and has a high adhesive strength of the plating film can efficiently be obtained with stability in an industrial process.

The plated molded article containing SPS of the present invention can advantageously be used, for example, for electric and electronic parts, such as printed boards, MID (molded interconnected devices), and electromagnetic wave shields, and high precision parts used in home electric appliances,

What is claimed is:

1. A plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), and has been oxidized and subsequently plated, wherein domains formed by component (B) in the surface part of the molded article within a depth of 50 μm from the surface have a ratio of the length of the major axis to the length of the minor axis of 10 or less.

2. A plated molded article which comprises a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), and has been oxidized and subsequently plated, wherein domains formed by component (B) in the surface part of the molded article within a depth of 50 μm from the surface have a ratio of the length of the major axis to the length of the minor axis of 10 or less and a length of the major axis of 5 μm or less.

3. A plated molded article which comprises a molded article formed with a resin composition comprising (A) 100 parts by weight of a styrenic polymer having a syndiotactic configuration and (B) (a') 1 to 100 parts by weight of a particulate elastomer having an average particle diameter of 0.5 μm or less and soluble in an oxidizing agent, and has been oxidized and subsequently plated.

4. A plated molded article which comprises a molded article formed with a resin composition comprising (A) 100 parts by weight of a styrenic polymer having a syndiotactic configuration and (B) (c') 3 to 100 parts by weight of inorganic compounds having an average particle diameter of 6 μm or less and a coefficient of variation of the particle diameter of 0.8 or less and soluble in an oxidizing agent, and has been oxidized and subsequently plated.

5. A process for producing a plated molded article which comprises oxidizing the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein the styrenic polymer having a syndiotactic configuration in the surface part of the molded article within a depth of 100 μm from the surface has a crystallinity of 15% or more.

6. A process for producing a plated molded article which comprises oxidizing the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein domains formed by component (B) in the surface part of the molded article within a depth of 50 μm from the surface have a ratio of the length of the major axis to the length of the minor axis of 10 or less.

7. A process for producing a plated molded article which comprises oxidizing the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein domains formed by component (B) in the surface part of the molded article within a depth of 50 μm from the surface have a ratio of the length of the major axis to the length of the minor axis of 10 or less and a length of the major axis of 5 μm or less.

8. A process for producing a plated molded article which comprises oxidizing the surface, providing polarity to the surface, and plating the surface, successively, of a molded article formed with a resin composition comprising (A) 100 parts by weight of a styrenic polymer having a syndiotactic configuration and (B) (a') 1 to 100 parts by weight of a particulate elastomer having an average particle diameter of 0.5 μm or less and soluble in an oxidizing agent.

9. A process for producing a plated molded article which comprises oxidizing the surface, providing polarity to the surface, and plating the surface, successively, of a molded article formed with a resin composition comprising (A) 100 parts by weight of a styrenic polymer having a syndiotactic configuration and (B) (c') 3 to 100 parts by weight of inorganic compounds having an average particle diameter of 6 μm or less and a coefficient of variation of the particle diameter of 0.8 or less and soluble in an oxidizing agent.

10. process for producing a plated molded article which comprises oxidizing the surface, providing polarity to the surface, and plating the surface, successively, of a molded article formed with a resin composition comprising (A) 20 to 99% by weight of a styrenic polymer having a syndiotactic configuration, (B) 80 to 1% by weight of at least one selected from the group consisting of (a) rubbery elastomers soluble in an oxidizing agent, (b) thermoplastic resins soluble in an oxidizing agent, and (c) inorganic compounds soluble in an oxidizing agent, and optionally (C) 1 to 350 parts by weight of an inorganic filler of glass based on 100 parts by weight of the total of component (A) and component (B), and/or (D) 0.5 to 10 parts by weight of a polymer having compatibility or affinity with component (A) and having a polar group based on 100 parts by weight of the total of component (A) and component (B), wherein the content of water in the molded article is 4,000 ppm or less.

* * * * *